United States Patent
Egoshi et al.

(10) Patent No.: US 8,487,418 B2
(45) Date of Patent: Jul. 16, 2013

(54) LED PACKAGE

(75) Inventors: Hidenori Egoshi, Fukuoka-ken (JP);
Kazuhiro Tamura, Fukuoka-ken (JP);
Hiroaki Oshio, Fukuoka-ken (JP);
Satoshi Shimizu, Fukuoka-ken (JP);
Teruo Takeuchi, Fukuoka-ken (JP);
Kazuhiro Inoue, Fukuoka-ken (JP);
Iwao Matsumoto, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 307 days.

(21) Appl. No.: 12/886,124

(22) Filed: Sep. 20, 2010

(65) Prior Publication Data

US 2011/0186875 A1 Aug. 4, 2011

(30) Foreign Application Priority Data

Jan. 29, 2010 (JP) ................................. 2010-019781
Jun. 24, 2010 (JP) ................................. 2010-143663

(51) Int. Cl.
*H01L 23/495* (2006.01)

(52) U.S. Cl.
USPC .................................. 257/676; 257/E23.042

(58) Field of Classification Search
USPC ............... 257/79, 88, 99, 678, 734, 661, 676, 257/692, E23.031, E23.042, E33.066
See application file for complete search history.

(56) References Cited

U.S. PATENT DOCUMENTS

| | | |
|---|---|---|
| 2008/0012036 A1 | 1/2008 | Loh |
| 2008/0185598 A1* | 8/2008 | Luo et al. ......................... 257/88 |
| 2009/0230413 A1* | 9/2009 | Kobayakawa et al. .......... 257/91 |
| 2010/0163920 A1* | 7/2010 | Itai ................................... 257/99 |
| 2010/0224890 A1* | 9/2010 | Keller et al. ..................... 257/93 |
| 2010/0258819 A1* | 10/2010 | Marfeld et al. ................. 257/80 |

FOREIGN PATENT DOCUMENTS

| | | |
|---|---|---|
| JP | 52-88569 | 7/1977 |
| JP | 04-230056 | 8/1992 |
| JP | 04-313257 | 11/1992 |
| JP | 08-186212 | 7/1996 |
| JP | 2003017753 | 1/2003 |
| JP | 2003110080 | 4/2003 |
| JP | 2003110145 | 4/2003 |
| JP | 2003-174200 | 6/2003 |
| JP | 2003-234509 | 8/2003 |
| JP | 2004-521506 | 7/2004 |
| JP | 2004-274027 | 9/2004 |
| JP | 2004247612 | 9/2004 |

(Continued)

OTHER PUBLICATIONS

Japanese Office Action for Application No. 2010-143663 mailed on Jan. 16, 2012.

(Continued)

*Primary Examiner* — Quoc Hoang
(74) *Attorney, Agent, or Firm* — Turocy & Watson, LLP

(57) ABSTRACT

According to one embodiment, an LED package includes (2×n) (n is an integer of 2 or more) lead frames, n LED chips and a resin body. The (2×n) lead frames are arranged to be apart from each other. The n LED chips are provided above the lead frames. Each of the n LED chips has one terminal connected to each of n lead frames of the (2×n) lead frames and another terminal connected to each of lead frames of the (2×n) lead frames other than the n lead frames. The resin body covers the (2×n) lead frames and the n LED chips.

15 Claims, 16 Drawing Sheets

FOREIGN PATENT DOCUMENTS

| | | |
|---|---|---|
| JP | 2005-033028 | 2/2005 |
| JP | 3108452 | 2/2005 |
| JP | 2005-353914 | 12/2005 |
| JP | 2006093672 | 4/2006 |
| JP | 2006147622 | 6/2006 |
| JP | 2007027281 | 2/2007 |
| JP | 3130684 | 3/2007 |
| JP | 2007-281218 | 10/2007 |
| JP | 2007-288198 | 11/2007 |
| JP | 2007-335762 | 12/2007 |
| JP | 2007318161 | 12/2007 |
| JP | 2008112966 | 5/2008 |
| JP | 2008153610 | 7/2008 |
| JP | 2008218469 | 9/2008 |
| JP | 2008270822 | 11/2008 |
| JP | 2009-147329 | 7/2009 |
| JP | 1375900 | 12/2009 |
| JP | 1375901 | 12/2009 |
| WO | 9627903 | 12/1996 |
| WO | 2005/091383 | 9/2005 |
| WO | 2008153043 A1 | 12/2008 |
| WO | 2009130957 A1 | 10/2009 |

OTHER PUBLICATIONS

Japanese Office Action for Application No. 2010-143663 issued on Sep. 20, 2011.
Chinese Office Action for Application No. 201010278021.1 mailed on Dec. 3, 2012.
Notification of Reasons for Refusal for Japanese Patent Application No. 2012-116218 Dated May 30, 2013, 4 pgs.

* cited by examiner

ULTRAVIOLET EXPOSURE

LED PACKAGE

CROSS-REFERENCE TO RELATED APPLICATIONS

This application is based upon and claims the benefit of priority from the prior Japanese Patent Application No. 2010-019781, filed on Jan. 29, 2010 and the prior Japanese Patent Application No. 2010-143663, filed on Jun. 24, 2010; the entire contents of which are incorporated herein by reference.

FIELD

Embodiments described herein relate generally to an LED package.

BACKGROUND

Conventionally, an LED package in which an LED chip is mounted has been configured in the following manner for controlling light distribution characteristics and increasing an efficiency of extracting light from the LED package. Specifically, a cup-shaped enclosure made of a white resin is provided to a LED package. Then, an LED chip is mounted on a bottom surface of the enclosure. The inside of the enclosure is filled with a transparent resin to bury the LED chip therewith. The enclosure is formed of a thermoplastic polyamide resin in many cases (for example, JP-A 2004-274027 (Kokai)).

However, recently the LED packages are required to have a higher durability because applications of LED packages expand. Meanwhile, a resin portion sealing an LED chip is facilitated degradation because light and heat radiated from LED chips increase. Moreover, further reduction in cost is demanded because applications of LED packages expand.

DETAILED DESCRIPTION

In general, according to one embodiment, an LED package includes (2×n) (n is an integer of 2 or more) lead frames, n LED chips and a resin body. The (2×n) lead frames are arranged to be apart from each other. The n LED chips are provided above the lead frames. Each of the n LED chips has one terminal connected to each of n lead frames of the (2×n) lead frames and another terminal connected to each of lead frames of the (2×n) lead frames other than the n lead frames. The resin body covers the (2×n) lead frames and the n LED chips.

According to another embodiment, an LED package includes (n+1) (n is an integer of 2 or more) lead frames, n LED chips and a resin body. The (n+1) lead frames are arranged to be apart from each other. The n LED chips are provided above the lead frames. Each of the n LED chips has one terminal connected to each of n lead frames of the (n+1) lead frames and another terminal connected to one lead frame of the (n+1) lead frames other than the n lead frames. The resin body covers the (n+1) lead frames and the n LED chips.

According to still another embodiment, an LED package includes first to sixth lead frames, a red LED chip, a blue LED chip, a green LED chip and a resin body. The first to sixth lead frames are arranged to be apart from each other. The red LED chip emits red light and is mounted on the first lead frame. The red LED chip has one terminal connected to the first lead frame and another terminal connected to the second lead frame. The blue LED chip emits blue light and is mounted at a position on the first lead frame where is situated nearer the third and the fourth lead frames in relation to the red LED chip. The blue LED chip has one terminal connected to the third lead frame and another terminal connected to the fourth lead frame. The green LED chip emits green light and is mounted at a position on the first lead frame where is situated nearer the fifth and the sixth lead frames in relation to the red LED chip. The green LED chip has one terminal connected to the fifth lead frame and another terminal connected to the sixth lead frame. The resin body has a rectangular shape, covers an entire upper surfaces, a portion of a lower surface, and a portion of one edge surface of each of the first to sixth lead frames, as well as the red LED chip, the blue LED chip and the green LED chip but exposing a remaining portion of the lower surface and a remaining portion of the one edge surface. The first lead frame includes a base portion and extending portions extending from the base portion, and having edge surfaces each exposed on a corresponding one of three different side surfaces of the resin body.

Hereinafter, embodiments of the invention will be described with reference to the drawings.

First of all, a first embodiment will be described.

Figure 1:
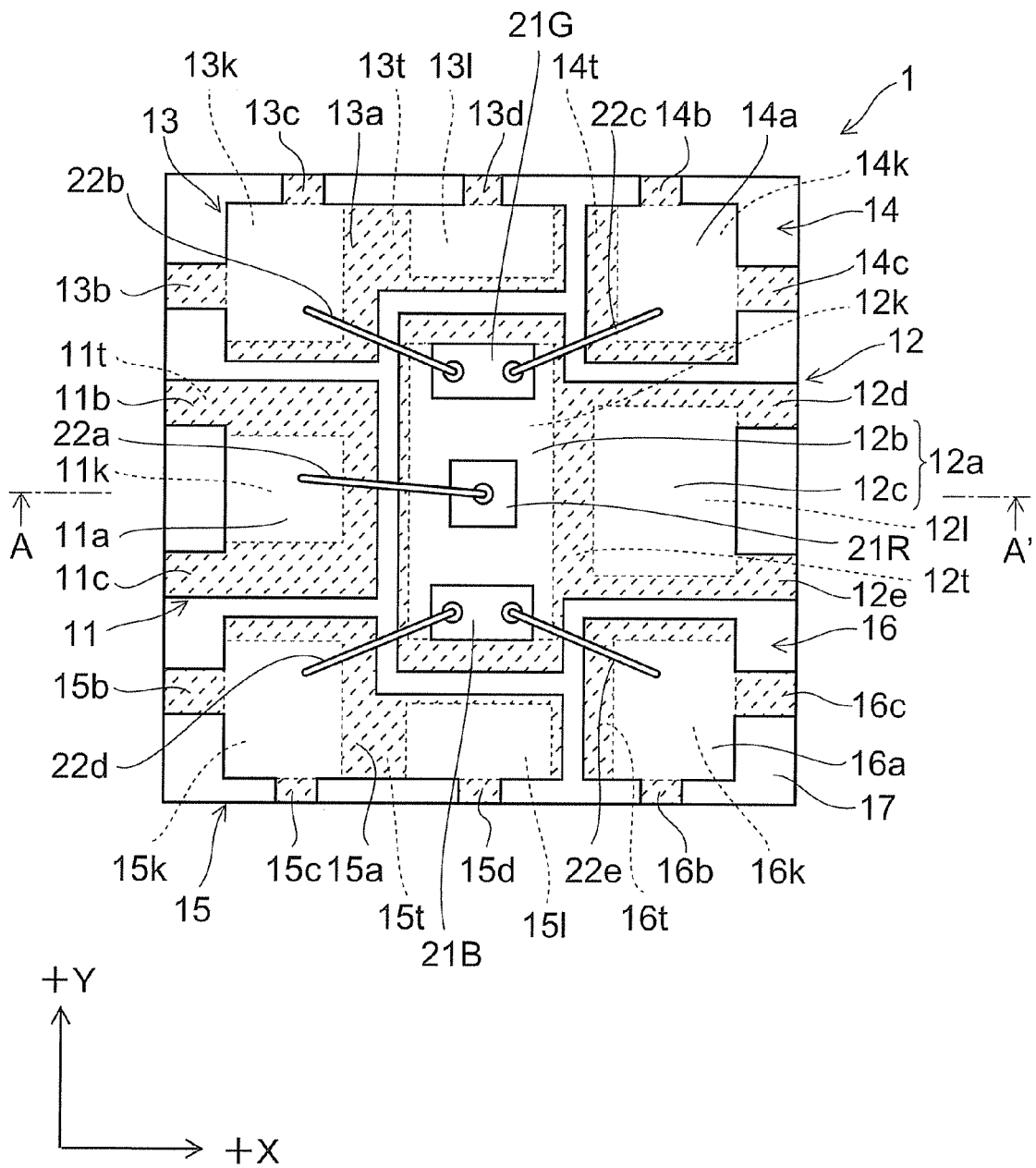
FIG. 1 is a plan view illustrating an LED package according to a first embodiment.

FIG. 1 is a plan view illustrating an LED package according to this embodiment.

Figure 2:
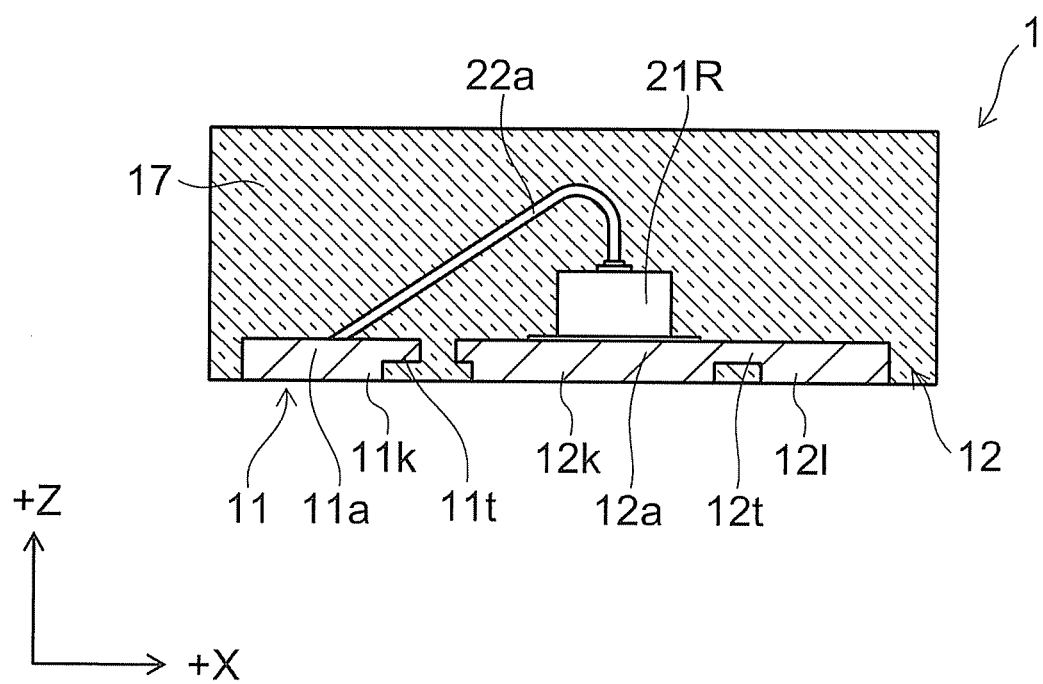
FIG. 2 is a cross-sectional view taken along the line A-A' shown in FIG. 1.

FIG. 2 is a cross-sectional view taken along the line A-A' shown in FIG. 1.

As shown in FIGS. 1 and 2, an LED package 1 according to this embodiment includes six lead frames 11 to 16. The lead frames 11 to 16 each have a planar shape, and are arranged to be flush with and apart from each other. The lead frames 11 to 16 are made of the same conductive material. For example, each of the lead frames 11 to 16 is a copper plate with silver plated layers formed on an upper surface and a lower surface thereof. Incidentally, no silver plated layer is formed on edge surfaces of the lead frames 11 to 16, and the copper plates are exposed therefrom.

Three LED chips 21R, 21G, 21B are provided above the lead frames 11 to 16. The LED chip 21R is a chip of vertical conduction type, which emits red light. The LED chip 21G is a chip of upper surface terminal type, which emits green light. The LED chip 21B is a chip of upper surface terminal type, which emits blue light. The chip of vertical conduction type includes terminals respectively on an upper surface and a lower surface thereof. The chip of upper surface terminal type includes two terminals on an upper surface thereof.

Moreover, the LED package 1 includes a transparent resin body 17 which covers the entire upper surface, a portion of a lower surface, and a portion of an edge surface of each of the lead frames 11 to 16, which also covers the LED chips 21R, 21G, 21B, but which exposes a remaining portion of the lower surface and a remaining portion of the edge surface of each of the lead frames 11 to 16. The transparent resin body 17 is formed of a transparent resin, for example, a silicone resin. Note that the term "transparent" includes meaning of translucent, also. The transparent resin body 17 has an appearance of rectangular parallelepiped. The appearance of the transparent resin body 17 is the appearance of the LED package 1.

Hereinafter, in this specification, for convenience of description, an XYZ rectangular coordinate system is introduced. Among directions parallel to the upper surfaces of the lead frames 11 to 16, a direction from the lead frame 11 to the lead frame 12 is defined as a +X direction. Among directions perpendicular to the upper surfaces of the lead frames 11 to 16, an upward direction, i.e., a direction in which the LED chips are mounted on the lead frame when seen therefrom, is defined as a +Z direction. Among directions which intersect both the +X direction and the +Z direction, a direction from the lead frame 15 to the lead frame 13 is defined as a +Y direction. Note that directions opposite to the +X direction, the +Y direction, and the +Z direction are respectively defined as a −X direction, a −Y direction, and a −Z direction. Meanwhile, for example, the "+X direction" and the "−X direction" may be collectively referred to as simply an "X direction."

Each of the lead frames 11 to 16 includes one base portion, and multiple extending portions extending from the base portion. A projected portion is formed at a lower surface of each base portion. Only a lower surface of the projected portion at the lower surface of each lead frame is exposed on a lower surface of the transparent resin body 17, while the other region of the lower surface of each lead frame is covered with the transparent resin body 17. Specifically, a lower surface of each of the extending portions is also covered with the transparent resin body 17. Additionally, only tip edge surfaces of the extending portions at the edge surface of each lead frame is exposed on a side surface of the transparent resin body 17, while the other region of the edge surface of each lead frame is covered with the transparent resin body 17. Specifically, an edge surface of the base portion, a side surface of the projected portion, and a side surface of the extending portion are covered with the transparent resin body 17. Furthermore, the entire regions of the upper surfaces of the lead frames 11 to 16 are covered with the transparent resin body 17. Additionally, the lower surface of the projected portion of each lead frame serves as an external electrode pad of the LED package 1. Note that, in this specification, the term "cover" is a concept including both a case where one that covers is in contact with one that is covered and a case where the two are not in contact with each other.

Hereinafter, the planar layout of the lead frames 11 to 16 will be described.

As shown in FIG. 1, in the LED package 1, the six lead frames 11 to 16 are arranged in two rows in the X direction, and in three rows in a Y direction. The layout of the lead frames 11 to 16 is symmetrical with respect to the XZ plane that passes through the center of the transparent resin body 17. The lead frames 11 and 12 are respectively disposed at a side edge portion in the −X direction and a side edge portion in the +X direction, which are in a central portion in the Y direction of the transparent resin body 17. The lead frames 13 and 14 are respectively disposed at a side edge portion in the −X direction and a side edge portion in the +X direction, which are in an end portion on the +Y direction side of the transparent resin body 17. The lead frames 15 and 16 are respectively disposed at a side edge portion in the −X direction and a side edge portion in the +X direction, which are in an end portion on the −Y direction side of the transparent resin body 17.

The lead frame 11 includes a base portion 11a that is rectangular when seen in a Z direction. From this base portion 11a, two extending portions 11b and 11c extends in the −X direction. The extending portions 11b and 11c respectively extend from an end portion on the +Y direction side and an end portion on the −Y direction side, which are of an edge of the base portion 11a, the edge facing the −X direction. A projected portion 11k is formed at the lower surface of the base portion 11a. A portion of the base portion 11a where the projected portion 11k is not formed is a thin plate portion 11t. When seen in the Z direction, the projected portion 11k has a rectangular shape, and the thin plate portion 11t has a C-shaped form opened in the −X direction. Note that, in FIG. 1, portions of the lead frames where the projected portions are not formed, i.e., the extending portions and the thin plate portions, are indicated by hatch with broken lines. The same applies to FIGS. 4, 5, 7, and 8 described later.

The lead frame 12 includes a base portion 12a that projects in the +X direction when seen in the Z direction. Specifically, the base portion 12a includes a rectangular portion 12b and a rectangular portion 12c. The rectangular portion 12b is disposed in a region including the center of the transparent resin body 17 when seen in the Z direction. The length in the Y direction of the rectangular portion 12b is longer than that of the lead frame 11. The rectangular portion 12c is disposed at the +X direction side of the rectangular portion 12b and continuous with the rectangular portion 12b. The length in the Y direction of the rectangular portion 12c is equal to that of the lead frame 11. Extending portions 12d and 12e respectively extend in the +X direction from an end portion on the +Y direction side and an end portion on the −Y direction side, which are of an edge of the rectangular portion 12c, the edge facing the +X direction. Projected portions 12k and 12l are respectively formed at the lower surfaces of the rectangular portions 12b and 12c. A portion of the base portion 12a where the projected portions 12k and 12l are not formed is a thin plate portion 12t. The projected portions 12k and 12l each have a rectangular shape when seen in the Z direction.

The lead frame 13 includes a base portion 13a that is L-shaped along the outer edges of a corner on the −X+Y side of the transparent resin body 17 when seen in the Z direction. From this base portion 13a, three extending portions 13b, 13c, 13d extend. The extending portion 13b extends in the −X direction from a central portion in the Y direction of an edge of the base portion 13a, the edge facing the −X direction. The extending portions 13c and 13d extend in the +Y direction respectively from a portion on the −X direction side and a portion on the +X direction, which are of an edge of the base portion 13a, the edge facing the +Y direction. A projected portion 13k is formed at a lower surface of a portion, of the base portion 13a, being in contact with the extending portions 13b and 13c. A projected portion 13l is formed at a lower surface of a portion that is in contact with the extending portion 13d. A portion of the base portion 13a where the projected portions 13k and 13l are not formed is a thin plate portion 13t. The projected portions 13k and 13l each have a rectangular shape when seen in the Z direction.

The lead frame 14 includes a base portion 14a that is rectangular when seen in the Z direction. From this base portion 14a, two extending portions 14b and 14c extend. The extending portion 14b extends in the +Y direction from a central portion in the X direction of an edge of the base portion 14a, the edge facing the +Y direction. The extending portion 14c extends in the +X direction from a central portion in the Y direction of an edge of the base portion 14a, the edge facing the +X direction. A projected portion 14k is formed at the lower surface of a portion of the base portion 14a, the portion being in contact with the extending portions 14b and 14c. A portion of the base portion 14a where the projected portion 14k is not formed is a thin plate portion 14t. The projected portion 14k has a rectangular shape when seen in the Z direction. The thin plate portion 14t has an L-shaped form along an edge on the −X direction side and an edge on the −Y direction side, which are of the base portion 14a. The layouts of the lead frames 15 and 16 are mirror images of those of the lead frames 13 and 14 with respect to the XZ plane that passes through the center of the transparent resin body 17. Each of the projected portions are formed in a region of the corresponding lead frame, the region being apart from edges of the lead frame, the edges facing each other. Regions including these edges are the thin plate portions.

The aforementioned LED chips 21R, 21G, 21B are mounted on the rectangular portion 12b of the base portion 12a of the lead frame 12, and disposed in a region immediately above the projected portion 12. The LED chips 21R, 21G, 21B are arranged in one row along the Y direction and apart from each other. The LED chip 21R is disposed in the middle, the LED chip 21G is disposed at the +Y direction side, and the LED chip 21B is disposed at the −Y direction side. When seen in the Z direction, the LED chip 21R is disposed almost at the center of the LED package 1. An upper surface terminal of the LED chip 21R is connected to the lead frame 11 through a wire 22a, and a lower surface terminal thereof is connected to the lead frame 12 with a conductive die mounting material (unillustrated) interposed therebetween. One terminal provided on the upper surface of the LED chip 21G is connected to the lead frame 13 through a wire 22b, while another terminal is connected to the lead frame 14 through a wire 22c. One terminal provided on the upper surface of the LED chip 21B is connected to the lead frame 15 through a wire 22d, while another terminal is connected to the lead frame 16 through a wire 22e. Note that the die mounting material is formed of, for example, a silver paste or solder, and the wires are formed of, for example, gold or aluminum.

Next, effects of this embodiment will be described.

In the LED package 1 according to this embodiment, each of the LED chips 21R, 21G, 21B is connected to different paired lead frames from each other. This enables the outputs of the LED chips 21R, 21G, 21B to be controlled independently from each other, and light of any intensity and color tone is emitted from the LED package 1.

Incidentally, in this embodiment, the number of LED chips is three, i.e., red (R), green (G), blue (B), but the number is not limited thereto. For example, besides the three LED chips of RGB, another LED chip for emitting green (G) light may be added, or an LED chip for emitting light of color other than RGB, for example, yellow or cyan may be added. Alternatively, the number of LED chips may be two, depending on usage. Additionally, the multiple LED chips mounted in one LED package may emit light of colors totally different from each other, or it is possible to configure some LED chips to emit light of the same color while the other to emit light of different color. Alternatively, all the LED chips may emit light of the same color. In this embodiment, when the number of LED chips is n (n is an integer of 2 or more), the number of lead frames is (2×n).

Moreover, in the LED package 1 according to this embodiment, no enclosure made of a white resin is provided. Accordingly, there is no enclosure that deteriorates through absorption of light and heat generated from the LED chips. Particularly, when an enclosure is formed of a thermoplastic polyamide resin, the deterioration of such an enclosure tends to progress faster. However, there is no risk of such deterioration in this embodiment. For this reason, the LED package 1 according to this embodiment has a high durability. Thus, the LED package 1 according to this embodiment has a long life and a high reliability, and is applicable in wide usage.

Furthermore, in the LED package 1 according to this embodiment, the transparent resin body 17 is formed of a silicone resin. Since a silicone resin has a high durability for light and heat, the durability of the LED package 1 is improved by this resin, also.

Still furthermore, in the LED package 1 according to this embodiment, no enclosure for covering the side surface of the transparent resin body 17 is provided. Accordingly, light is emitted at a wide angle. For this reason, the LED package 1 according to this embodiment is particularly advantageously used when light needs to be emitted at a wide angle.

Still furthermore, in the LED package 1 according to this embodiment, transparent resin body 17 covers portions of the lower surfaces and large portions of the edge surfaces of the lead frames 11 to 16, and holds peripheral portions of the lead frames. In this manner, the lower surfaces of the projected portions of the lead frames are exposed on the transparent resin body 17, and external electrode pads are formed; moreover, the holdability of the lead frame is increased. This makes the lead frames 11 to 16 hardly detached from the transparent resin body 17 in dicing, and the yield of the LED package 1 is improved. Furthermore, when the LED package 1 is used, the lead frames 11 to 16 are prevented from being detached from the transparent resin body 17, the detachment being attributable to thermal stress.

Still furthermore, in the LED package 1 according to this embodiment, the silver plated layers are formed on the upper and lower surfaces of the lead frames. Since silver plated layers have a high light reflectivity, the LED package 1 according to this embodiment has a high light extraction efficiency.

Still furthermore, in the LED package 1 according to this embodiment, the extending portions extending from the base portions of the lead frames prevent complete exposure of the base portions from the side surfaces of the transparent resin body 17, reducing the exposed areas of the lead frames. Additionally, the contact area between the lead frames 11 to 16 and the transparent resin body 17 is increased. As a result, the lead frames are prevented from being detached from the transparent resin body 17. Moreover, the corrosion of the lead frames is also suppressed.

Still furthermore, in this embodiment, the LED chips 21R, 21G, 21B are disposed in the region immediately above the projected portion 12k of the lead frame 12. Since a lower surface of the projected portion 12k is exposed on the lower surface of the transparent resin body 17 and connected to an external wire or the like, heat generated in the LED chips flows in the direction immediately below (−Z direction) through the lead frame 12 and dissipated to the outside. As a result, the LED package 1 according to this embodiment has favorable heat dissipation properties.

Next, a second embodiment will be described.

Figure 3:
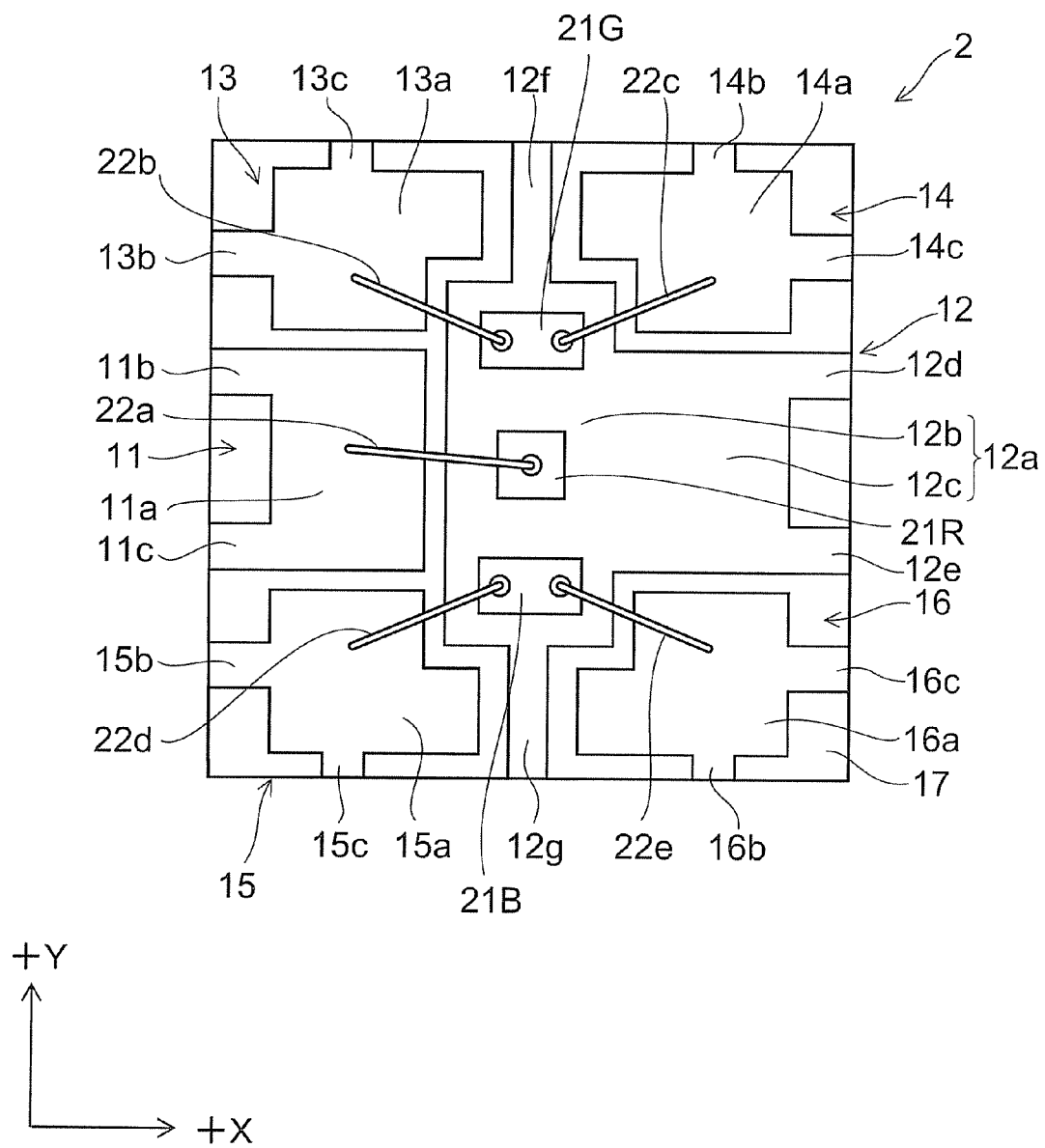
FIG. 3 is a plan view illustrating an LED package according to a second embodiment.

FIG. 3 is a plan view illustrating an LED package according to this embodiment.

As shown in FIG. 3, an LED package 2 according to this embodiment is different from the above-described LED package 1 according to the first embodiment (see FIG. 1) in lead frame layout. Specifically, in this embodiment, portions, of the base portions 13a and 15a of the lead frames 13 and 15, extending in the +X direction are short. Portions, of the base portions 14a and 16a of the lead frames 14 and 16, facing the short portions extend in the −X direction. Moreover, an extending portion 12f of the lead frame 12 passes between the lead frame 13 and the lead frame 14, while an extending portion 12g of the lead frame 12 passes between the lead frame 15 and the lead frame 16. The extending portion 12f extends in the +Y direction from the rectangular portion 12b of the base portion 12a of the lead frame 12, while the extending portion 12g extends in the −Y direction from a portion of the rectangular portion 12b. Additionally, the lead frames 13 and 15 do not include the extending portions 13d and 15d (see FIG. 1).

In this embodiment, the lead frame 12 is supported by the extending portions 12d to 12g in three directions. Accordingly, when the wires 22a to 22e are bonded to the LED chips 21R, 21G, 21B mounted on the rectangular portion 12b of the lead frame 12, the bonding portions are tightly fixed. Thus, the wire bonding is improved. Configurations and effects other than the above, of this embodiment are the same as those of the above-described first embodiment.

Next, a third embodiment will be described.

Figure 4:
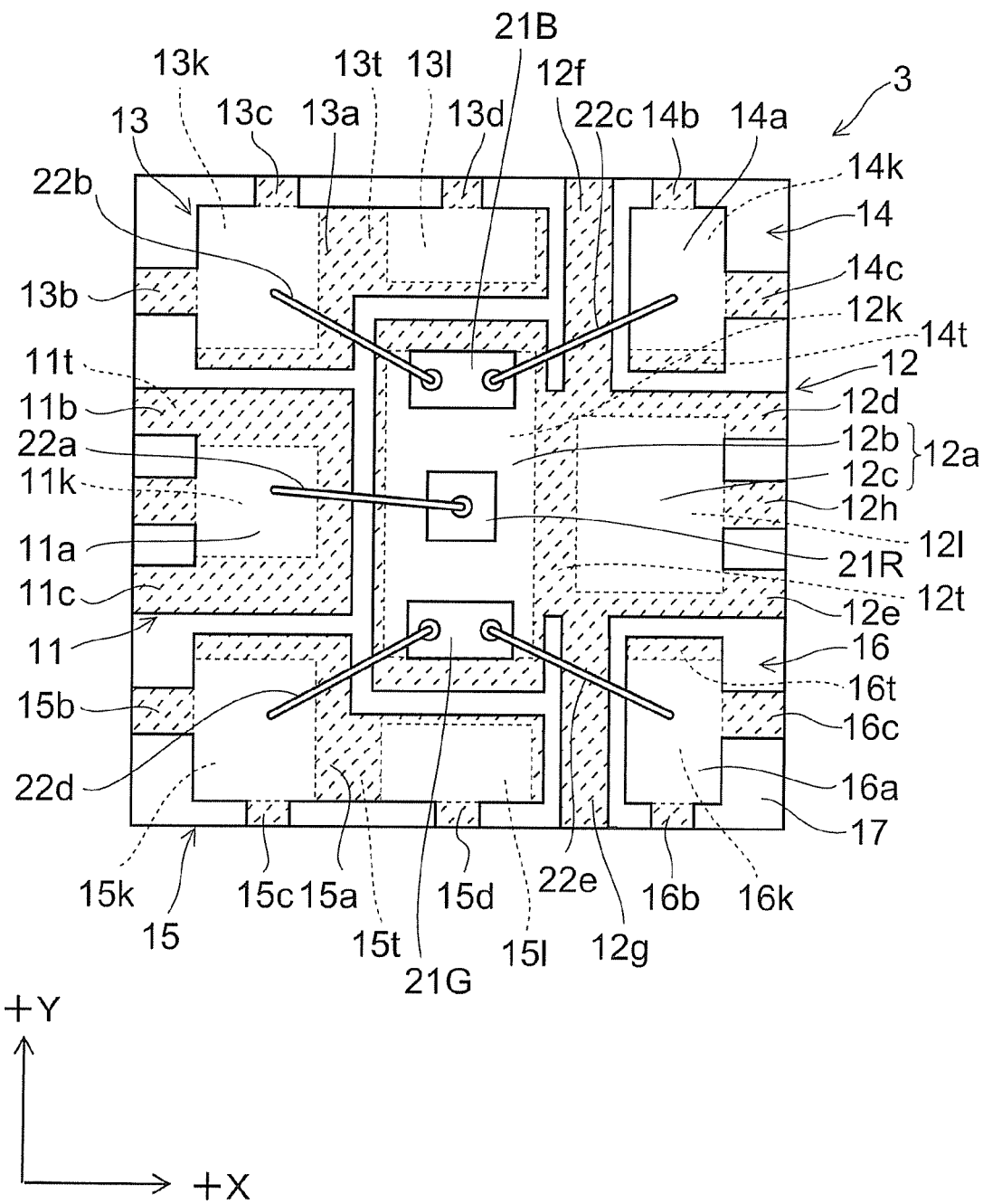
FIG. 4 is a plan view illustrating an LED package according to a third embodiment.

FIG. 4 is a plan view illustrating an LED package according to this embodiment.

As shown in FIG. 4, an LED package 3 according to this embodiment is different from the above-described LED package 1 according to the first embodiment (see FIG. 1) in lead frame layout and order of arranging LED chips.

Specifically, in this embodiment, the lengths in the X direction of the lead frames 14 and 16 are shorter than those in the above-described first embodiment. The thin plate portion 14t and 16t are eliminated from edge portions on the −X direction sides of the base portions 14a and 16a. Accordingly, edges on the −X direction sides of the lead frames 14 and 16 are located closer to the +X direction sides thereof. This increases the distance between the lead frame 14 and the lead frame 13, and the distance between the lead frame 16 and the lead frame 15. Meanwhile, the lead frame 12 includes extending portions 12f, 12g, 12h besides the extending portions 12d and 12e. The extending portion 12f extends in the +Y direction from the rectangular portion 12c, and passes between the lead frame 13 and the lead frame 14. A tip edge surface of the extending portion 12f is exposed on the side surface, of the transparent resin body 17, facing the +Y direction. The extending portion 12g extends in the −Y direction from the rectangular portion 12c, and passes between the lead frame 15 and the lead frame 16. A tip edge surface of the extending portion 12g is exposed on the side surface, of the transparent resin body 17, facing the −Y direction. Moreover, the extending portion 12h is disposed between the extending portion 12d and the extending portion 12e, and extends in the +X direction from the rectangular portion 12c. A tip edge surface of the extending portion 12h is exposed on the side surface, of the transparent resin body 17, facing the +X direction.

In this manner, the lead frame 12 includes the five extending portions 12d to 12h. The tip edge surfaces of the extending portions 12d, 12e, and 12h are exposed on the side surface, of the transparent resin body 17, facing the +X direction. The tip edge surface of the extending portion 12f is exposed on the side surface, of the transparent resin body 17, facing the +Y direction, while the tip edge surface of the extending portion 12g is exposed on the side surface, of the transparent resin body 17, facing the −Y direction. In sum, portions of the edge surfaces, of the lead frame 12, respectively facing the +X direction, the +Y direction, and the −Y direction are exposed on the corresponding side surfaces, of the transparent resin body 17, respectively facing the +X direction, the +Y direction, and the −Y direction. Note that remaining portions of these edge surfaces and the entire edge surface facing the −X direction are covered with the transparent resin body 17. As a result, the lead frame 12 is exposed on three side surfaces out of four side surfaces of the transparent resin body 17.

Moreover, in similar to the above-described first embodiment, the extending portions 11b and 11c of the lead frame 11 are exposed on the side surface, of the transparent resin body 17, facing the −X direction. The extending portions 13b to 13d of the lead frame 13 are exposed on the side surfaces, of the transparent resin body 17, respectively facing the −X direction and the +Y direction. The extending portions 14b and 14c of the lead frame 14 are exposed on the side surfaces, of the transparent resin body 17, respectively facing the +Y direction and the +X direction. The extending portions 15b to 15d of the lead frame 15 are exposed on the side surfaces, of the transparent resin body 17, respectively facing the −X direction and the −Y direction. The extending portions 16b and 16c of the lead frame 16 are exposed on the side surfaces, of the transparent resin body 17, respectively facing the −Y direction and the +X direction. Meanwhile, a region, other than the tip edge surfaces of the extending portions, of the edge surface of each lead frame is covered with the transparent resin body 17. In this manner, the lead frame 12 is exposed on the three side surfaces of the transparent resin body 17. The lead frames 13, 14, 15 and 16 are exposed on corresponding two side surfaces of the transparent resin body 17. The lead frame 11 is exposed on one side surface of the transparent resin body 17.

Moreover, the LED package 3 includes the LED chips 21R, 21G, 21B mounted on the rectangular portion 12b of the lead frame 12, in similar to the above-described LED package 1 according to the first embodiment (see FIG. 1). In the LED package 3, however, the position of the LED chip 21G for emitting green light and the position of the LED chip 21B for emitting blue light are different from those in the LED package 1 in a manner that the positions are switched from each other. In other words, in this embodiment also, the LED chip 21B, the LED chip 21G, and the LED chip 21R for emitting red light are arranged in one row along the Y direction and apart from each other in the region immediately above the projected portion 12k, and the LED chip 21R is disposed in the middle, in similar to the above-described first embodiment. However, unlike the above-described first embodiment, the LED chip 21B is disposed at the +Y direction side, and the LED chip 21G is disposed at the −Y direction side. In other words, the LED chip 21B is mounted at a position closer to the lead frames 14 and 13 when seen from the LED chip 21R. The LED chip 21G is mounted at a position closer to the lead frames 16 and 15 when seen from the LED chip 21R.

In this embodiment, the lead frame 12 on which the three LED chips are mounted can be supported by the five extending portions 12d to 12h in three directions. Accordingly, when a wire is bonded to each of the LED chips, the bonding portion can be tightly fixed. Specifically, the lead frame 12 is supported not only from the +X direction side by the extending portions 12d, 12e, 12h, but also the lead frame 12 can be supported at a neck portion located at a central portion in the X direction of the lead frame 12 from the +Y direction side and the −Y direction side by the extending portions 12f and 12g, respectively. Thereby, the oscillation at the neck portion of the lead frame 12 can be suppressed in the process of mounting LED chips on the lead frame 12 and in the process of bonding wires to the LED chips. Thus, the mountability of the LED chips and the wire bonding are favorable. Configurations and effects other than the above, of this embodiment are the same as those of the above-described first embodiment.

Next, a variation of this embodiment will be described.

Figure 5:
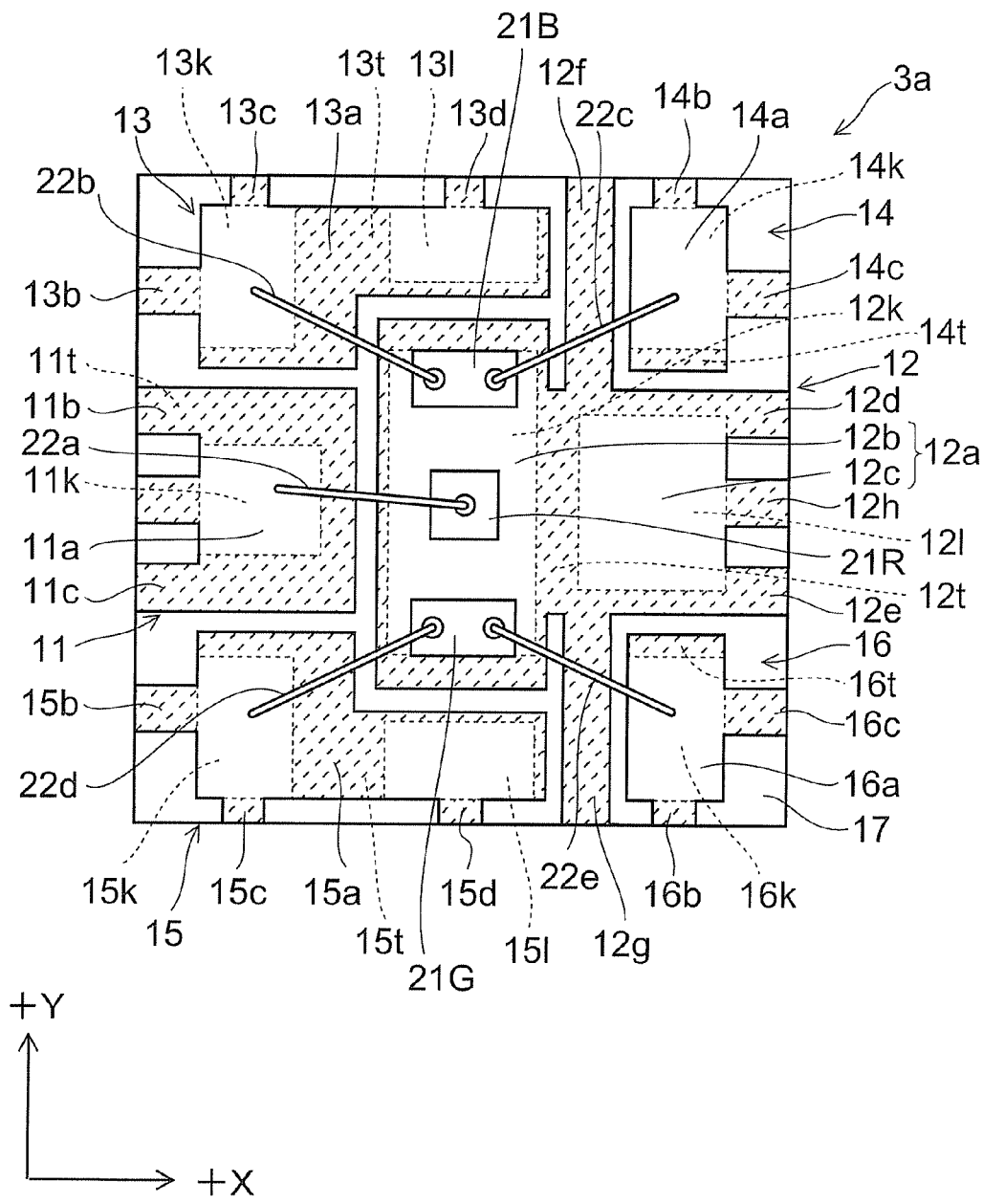
FIG. 5 is a plan view illustrating an LED package according to a variation of the third embodiment.

FIG. 5 is a plan view illustrating an LED package according to this variation.

As shown in FIG. 5, in an LED package 3a according to this variation, the length in the X direction of the projected portion 13k of the lead frame 13 is shorter than that in the above-described LED package 3 according to the third embodiment (see FIG. 4). An edge on the +X direction side of the projected portion 13k is located closer to the −X direction side. This is compensated by the increased length in the X direction of a portion, of the thin plate portion 13t, sandwiched between the projected portion 13k and the projected portion 13l. As to the lead frame 15, similarly, the length in the X direction of the projected portion 15k is short, which is compensated by the increased length in the X direction of a portion, of a thin plate portion 15t, sandwiched between the projected portion 15k and a projected portion 15l.

In this variation, the areas of the thin plate portions 13t and 15t are larger than those in the above-described third embodiment. Since the transparent resin body 17 goes around and enters regions immediately below the thin plate portions 13t and 15t, the transparent resin body 17 favorably holds the lead frames 13 and 15. Configurations and effects other than the above, of this variation are the same as those of the above-described third embodiment.

Next, a fourth embodiment will be described.

Figure 6:
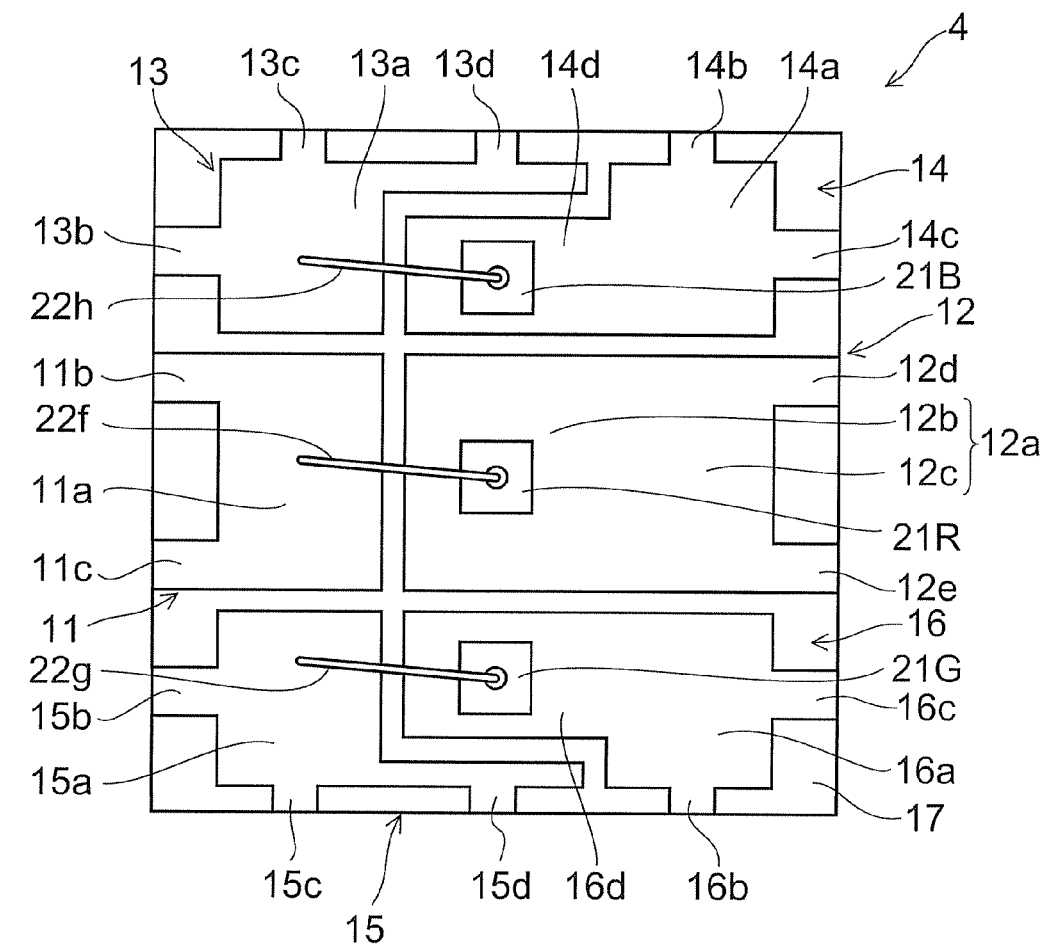
FIG. 6 is a plan view illustrating an LED package according to a fourth embodiment.

FIG. 6 is a plan view illustrating an LED package according to this embodiment.

As shown in FIG. 6, an LED package 4 according to this embodiment is different from the above-described LED package 1 according to the first embodiment (see FIG. 1) in type of LED chips and lead frame layout. Specifically, in this embodiment, all the LED chips 21R, 21G, 21B are chips of vertical conduction type, and each includes an upper surface terminal and a lower surface terminal.

The length in the Y direction of the rectangular portion 12b of the lead frame 12 is equal to the lengths in the Y direction of the rectangular portion 12c and the lead frame 11. Moreover, from the base portions 14a and 16a of the lead frames 14 and 16, rectangular portions 14d and 16d extend in the −X direction, respectively. Thus, in comparison with that in the above-described first embodiment, the area of the base portion 12a of the lead frame 12 is decreased, and the areas of the base portion 14a of the lead frame 14 and the base portion 16a of the lead frame 16 are increased. Additionally, the LED chip 21R is mounted on the base portion 12a of the lead frame 12, the LED chip 21G is mounted on the rectangular portion 16d of the base portion 16a of the lead frame 16, and the LED chip 21B is mounted on the rectangular portion 14d of the base portion 14a of the lead frame 14. The lower surface terminals of the LED chips 21R, 21G, 21B are connected, with conductive die mounting materials (unillustrated) interposed therebetween, to the respective lead frames on which the die mounting materials themselves are mounted. Moreover, the upper surface terminals of the LED chips 21R, 21G, 21B are respectively connected to the lead frames 11, 15, 13 through wires 22f, 22g, 22h.

In this embodiment, the LED chips 21R, 21G, 21B are mounted on the different lead frames from each other. Accordingly, loads applied to the lead frames are distributed. Moreover, since all the LED chips are of vertical conduction type, this helps to reduce the number of wires, simplifies the wire bonding process, and surely prevents the wires from contacting each other. Configurations and effects other than the above, of this embodiment are the same as those of the above-described first embodiment.

Next, a fifth embodiment will be described.

Figure 7:
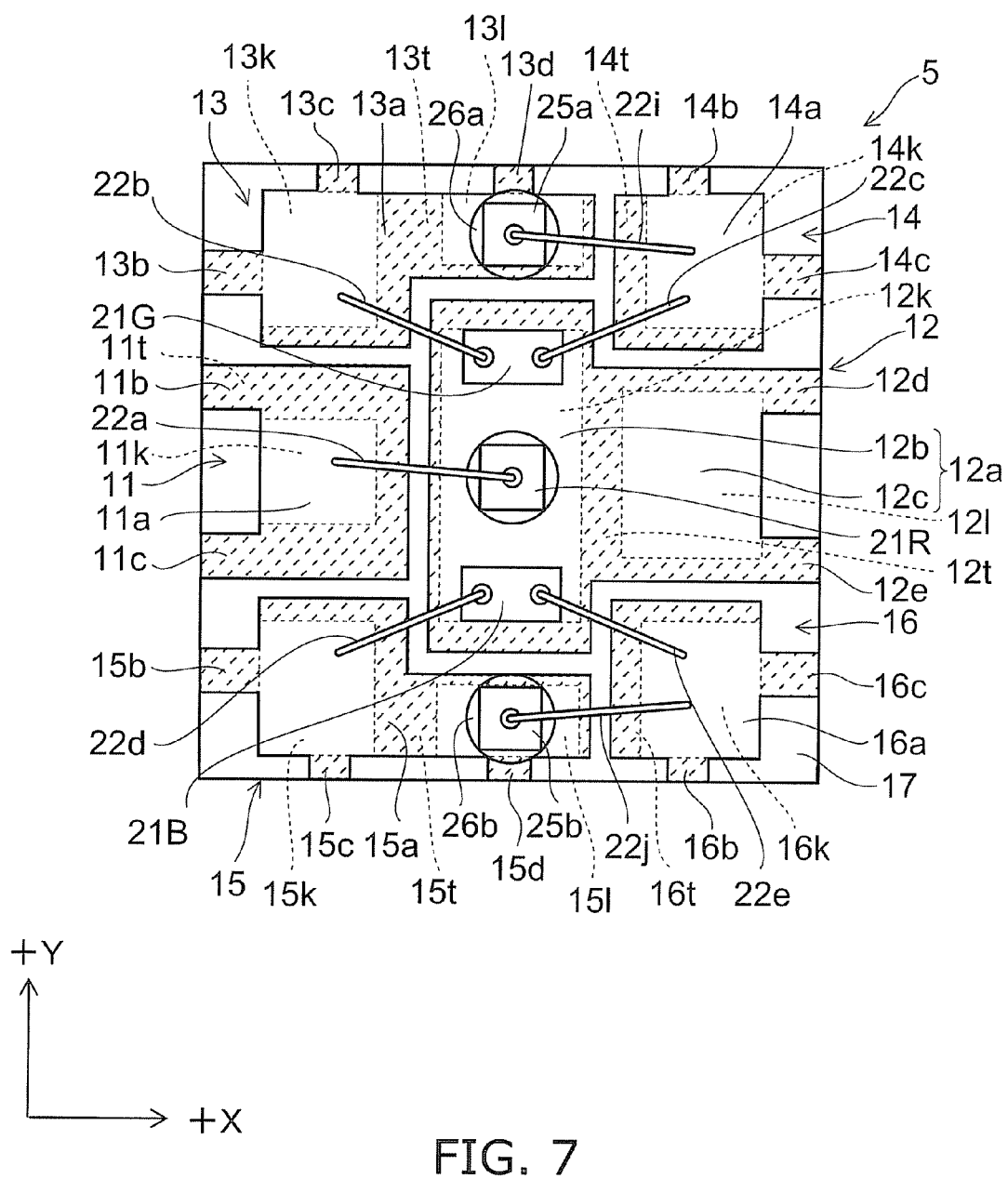
FIG. 7 is a plan view illustrating an LED package according to a fifth embodiment.

FIG. 7 is a plan view illustrating an LED package according to this embodiment.

As shown in FIG. 7, an LED package 5 according to this embodiment includes Zener diode chips 25a and 25b in addition to the configuration of the above-described LED package 1 according to the first embodiment (see FIG. 1). The Zener diode chips 25a and 25b are chips of vertical conduction type.

The Zener diode chip 25a is mounted on the base portion 13a of the lead frame 13. A lower surface terminal of the Zener diode chip 25a is connected to the lead frame 13 with a conductive die mounting material 26a interposed therebetween, and an upper surface terminal thereof is connected to the lead frame 14 through a wire 22i. In this manner, the Zener diode chip 25a is connected in parallel to the LED chip 21G between the lead frame 13 and the lead frame 14. The Zener diode chip 25b is mounted on the base portion 15a of the lead frame 15. A lower surface terminal of the Zener diode chip 25b is connected to the lead frame 15 with a conductive die mounting material 26b interposed therebetween, and an upper surface terminal thereof is connected to the lead frame 16 through a wire 22j. In this manner, the Zener diode chip 25b is connected in parallel to the LED chip 21B between the lead frame 15 and the lead frame 16. Moreover, the Zener diode chip 25a is disposed in a region immediately above the projected portion 13l of the lead frame 13, and the Zener diode chip 25b is disposed in a region immediately above the projected portion 15l of the lead frame 15.

According to this embodiment, the Zener diode chips 25a and 25b are provided to improve the durability for electrostatic discharge (ESD). Moreover, since the Zener diode chips 25a and 25b are respectively disposed in the regions immediately above the projected portions 13l and 15l of the lead frames 13 and 15, the heat dissipation properties are favorable. Configurations and effects other than the above, of this embodiment are the same as those of the above-described first embodiment.

Next, a sixth embodiment will be described.

Figure 8:
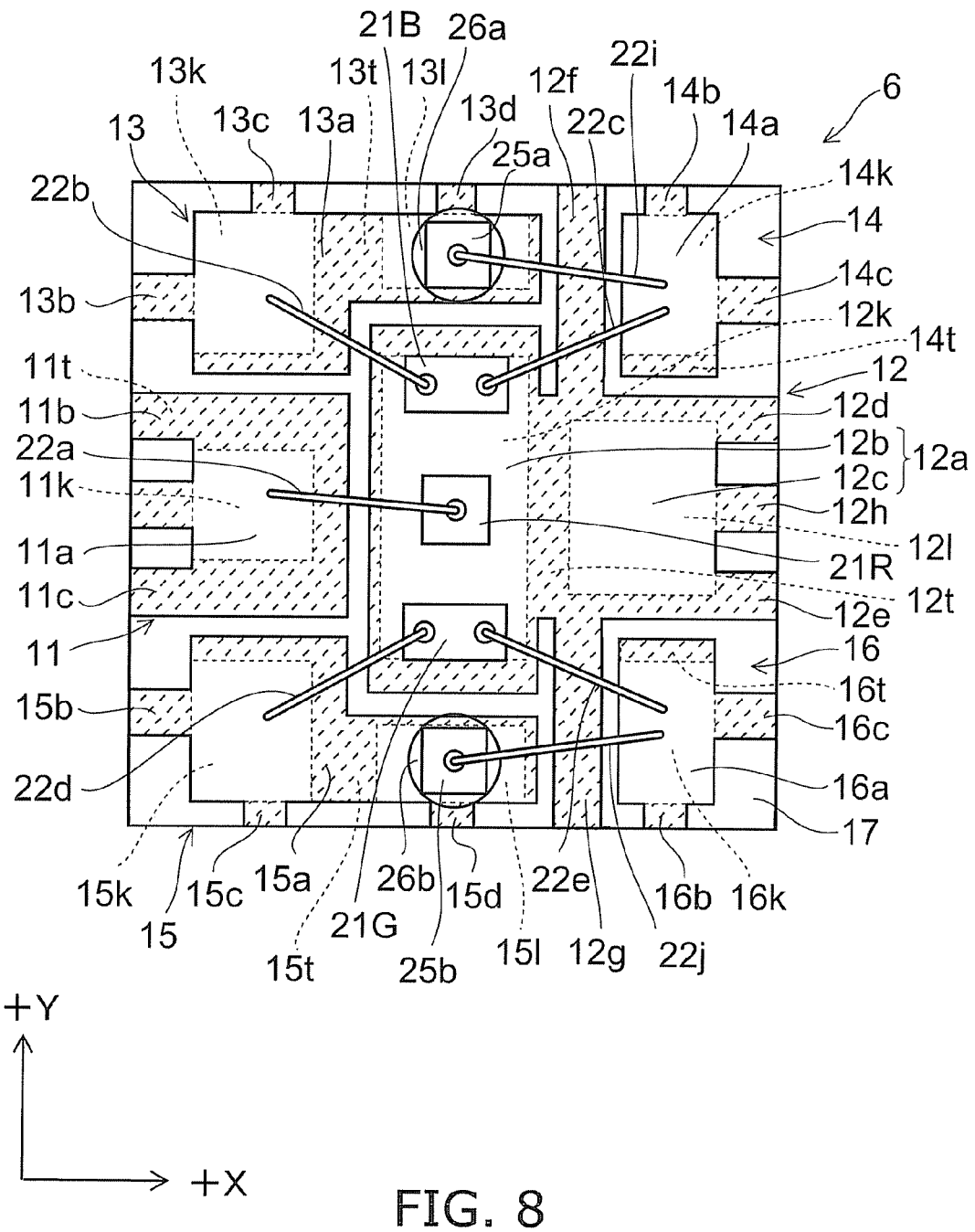
FIG. 8 is a plan view illustrating an LED package according to a sixth embodiment.

FIG. 8 is a plan view illustrating an LED package according to this embodiment.

As shown in FIG. 8, this embodiment is an example of combination of the third embodiment and the fifth embodiment. Specifically, an LED package 6 according to this embodiment includes the Zener diode chips 25a and 25b of vertical conduction type in addition to the configuration of the above-described LED package 3 according to the third embodiment (see FIG. 4).

In similar to the above-described fifth embodiment, the Zener diode chip 25a is mounted on the base portion 13a of the lead frame 13 and in the region immediately above the projected portion 13l, and is connected in parallel to the LED chip 21B between the lead frame 13 and the lead frame 14. The Zener diode chip 25b is mounted on the base portion 15a of the lead frame 15 and in the region immediately above the projected portion 15*l*, and is connected in parallel to the LED chip 21G between the lead frame 15 and the lead frame 16. More specifically, the lower surface terminal of the Zener diode chip 25*a* is connected to the lead frame 13 with the conductive die mounting material 26*a* interposed therebetween, and the upper surface terminal thereof is connected to the lead frame 14 through the wire 22*i*. Meanwhile, the lower surface terminal of the Zener diode chip 25*b* is connected to the lead frame 15 with the conductive die mounting material 26*b* interposed therebetween, and the upper surface terminal thereof is connected to the lead frame 16 through the wire 22*j*.

The LED package 6 according to this embodiment is higher in ESD durability than the above-described LED package 3 according to the third embodiment. Configurations and effects other than the above, of this embodiment are the same as those of the above-described third embodiment. Incidentally, the Zener diode chips 25*a* and 25*b* may be mounted in the above-described LED package according to the variation of the third embodiment.

Next, a seventh embodiment will be described.

Figure 9:
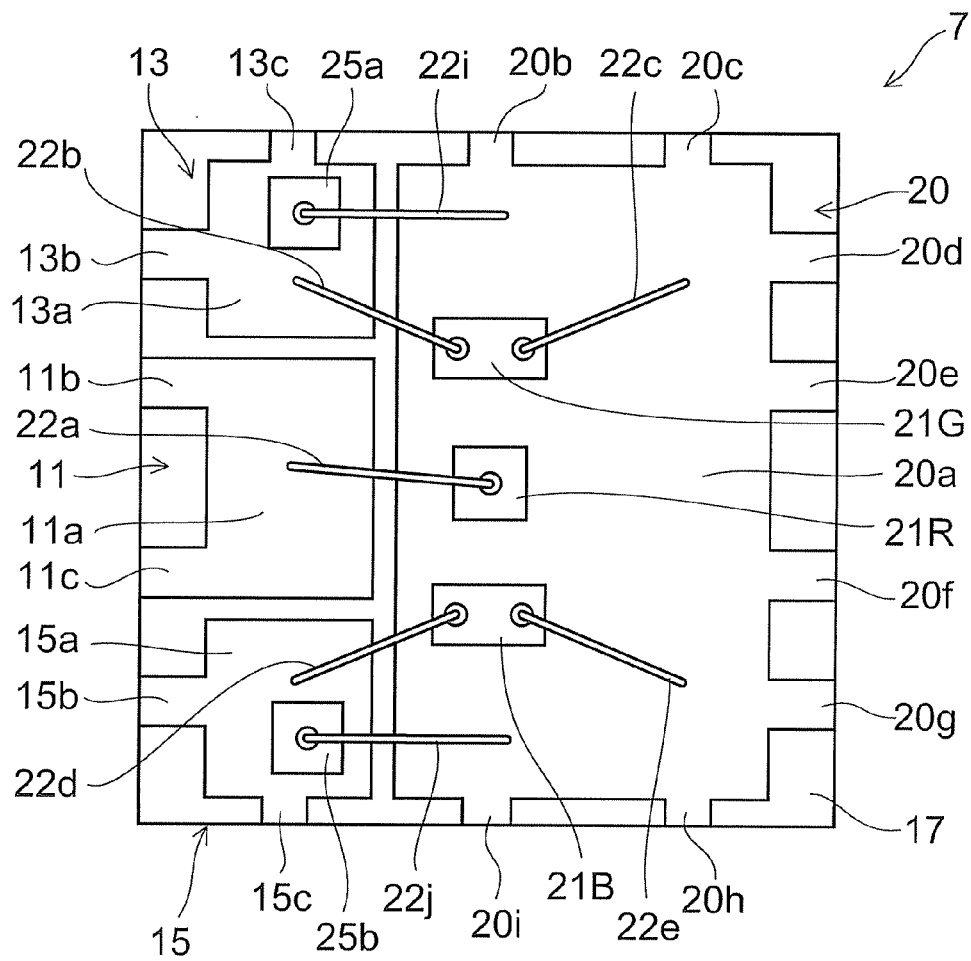
FIG. 9 is a plan view illustrating an LED package according to a seventh embodiment.

FIG. 9 is a plan view illustrating an LED package according to this embodiment.

As shown in FIG. 9, an LED package 7 according to this embodiment is different from the above-described LED package 5 according to the fifth embodiment (see FIG. 7) in lead frame layout and wiring method for LED chips.

Specifically, in this embodiment, the base portions 13*a* and 15*a* of the lead frames 13 and 15 each have a rectangular shape when seen in the Z direction, and the portions extending in the +X direction are eliminated. Moreover, one lead frame 20 is provided instead of the lead frames 12, 14, 16 (see FIG. 1). The lead frame 20 includes one base portion 20*a* that is rectangular when seen in the Z direction. From the base portion 20*a*, eight extending portions 20*b* to 20*i* extend. The extending portions 20*b* to 20*i* are disposed at positions corresponding to the extending portions 13*d*, 14*b*, 14*c*, 12*d*, 12*e*, 16*c*, 16*b*, 15*d* of the above-described LED package 1 according to the first embodiment (see FIG. 1).

The another terminal of the LED chip 21G is connected to the lead frame 20 through the wire 22*c*, and the another terminal of the LED chip 21B is connected to the lead frame 20 through the wire 22*e*. In this manner, the another terminals of the LED chips 21R, 21G, 21B are connected in common to the lead frame 20. For example, cathodes of the LED chips are connected in common to the lead frame 20, to which, for example, a ground potential is applied. In this case, anodes of the LED chips are connected to the different lead frames from each other.

According to this embodiment, four lead frames control three LED chips independently from each other. Moreover, since the Zener diode chips 25*a* and 25*b* are provided, the ESD durability is favorable. Configurations and effects other than the above, of this embodiment are the same as those of the above-described first embodiment. Note that, when the number of LED chips is n, the number of lead frames is (n+1).

Next, an eighth embodiment will be described.

Figure 10:
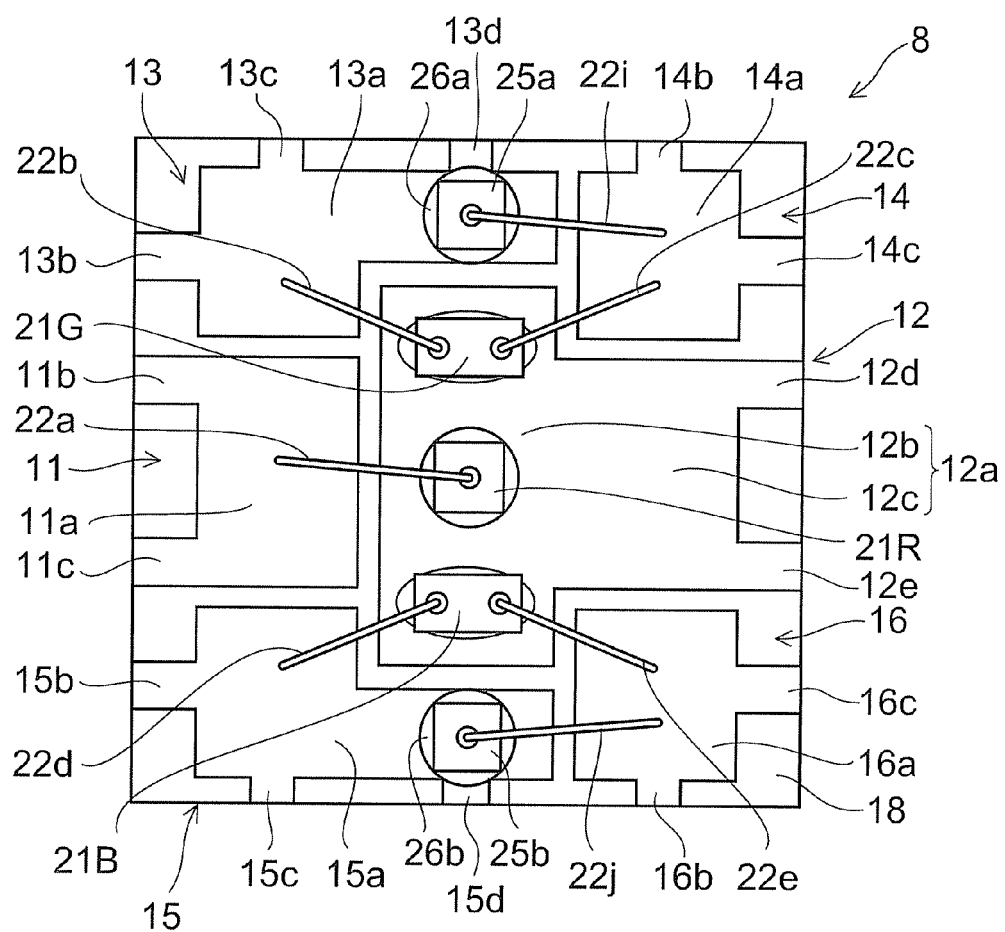
FIG. 10 is a plan view illustrating an LED package according to an eighth embodiment.
Figure 10:
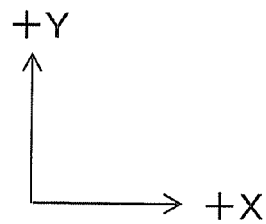

FIG. 10 is a plan view illustrating an LED package according to this embodiment.

As shown in FIG. 10, an LED package 8 according to this embodiment is different from the above-described LED package 5 according to the fifth embodiment (see FIG. 7) in that the transparent resin body 17 contains a diffusing agent for scattering light. Specifically, the LED package 8 includes a diffusing agent-containing transparent resin body 18 instead of the transparent resin body 17 (see FIG. 7). The diffusing agent is, for example, a microsphere made of a transparent resin having a refractive index different from the refractive index of the resin material for forming the transparent resin body 17.

In this embodiment, the diffusing agent added to the diffusing agent-containing transparent resin body 18 enables effective mixing of light emitting from the LED chips 21R, 21G, 21B, thus reducing the direction dependency of color tone of light emitted from the LED package 8. Configurations and effects other than the above, of this embodiment are the same as those of the above-described first embodiment.

Next, a ninth embodiment will be described.

This embodiment is an embodiment of a method for manufacturing the LED package according to the above-described embodiments.

Figure 11:
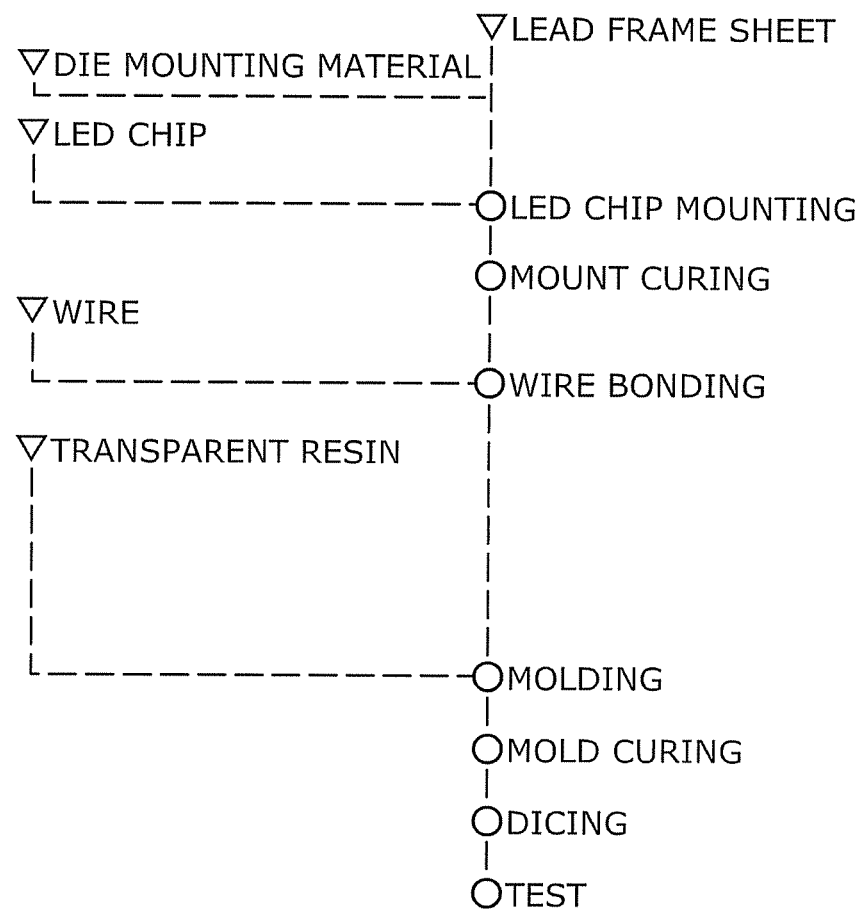
FIG. 11 is a flowchart illustrating a method for manufacturing an LED package according to a ninth embodiment.

FIG. 11 is a flowchart illustrating the method for manufacturing an LED package according to this embodiment.

FIGS. 12A to 14B are process cross-sectional views illustrating the method for manufacturing an LED package according to this embodiment.

Figure 15A:
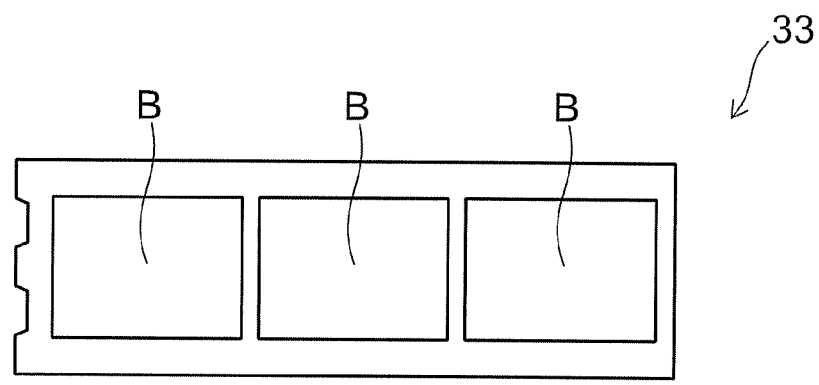
FIG. 15A is a plan view illustrating a lead frame sheet in the ninth embodiment and FIG. 15B is a partially enlarged plan view illustrating element regions of the lead frame sheet.
Figure 15B:
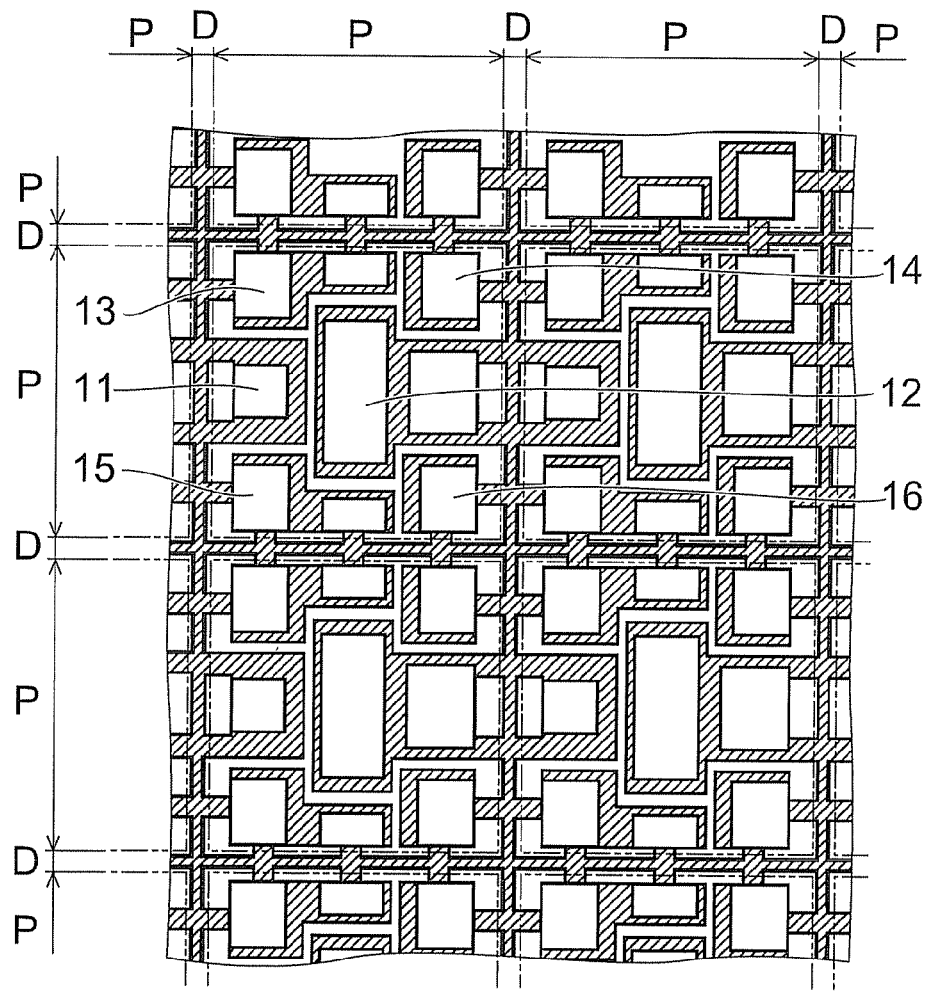

FIG. 15A is a plan view illustrating a lead frame sheet in this embodiment. FIG. 15B is a partially enlarged plan view illustrating element regions of the lead frame sheet.

Incidentally, in FIGS. 12A to 15B, for convenience of illustration, each LED package is drawn with a simplified structure. For example, LED chips are collectively referred to as an LED chip 21, and wires are collectively referred to as a wire 22.

Figure 12A:
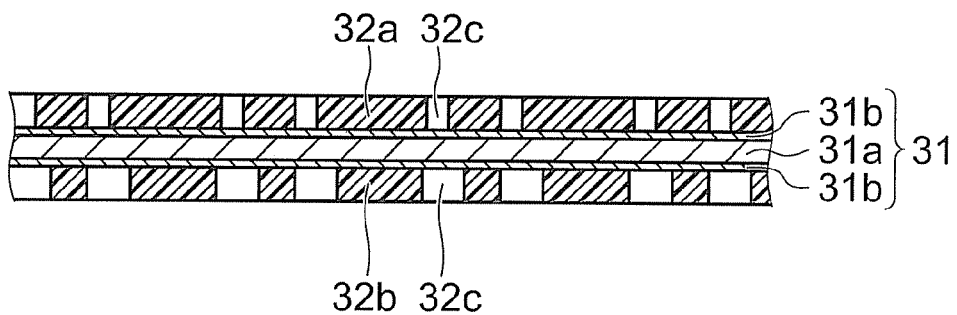
FIGS. 12A to 14B are process cross-sectional views illustrating the method for manufacturing an LED package according to the ninth embodiment.

First, a conductive sheet 31 made of a conductive material is prepared as shown in FIG. 12A. The conductive sheet 31 is, for example, a strip-shaped copper plate 31*a* with silver plated layers 31*b* formed on upper and lower surfaces thereof. Next, masks 32*a* and 32*b* are formed respectively on the resultant upper and lower surfaces of the conductive sheet 31. Openings 32*c* are selectively formed in the masks 32*a* and 32*b*. The masks 32*a* and 32*b* can be formed by a printing method, for example.

Next, the conductive sheet 31 to which the masks 32*a* and 32*b* are attached is immersed in an etchant, and the conductive sheet 31 is wet-etched. Thereby, portions of the conductive sheet 31, locating inside the openings 32*c* are selectively removed by etching. In this event, for example, by adjusting the immersion time, the etching amount is controlled, so that the etching is stopped before the conductive sheet 31 is penetrated by sole etching from either the upper surface side or the lower surface side of the conductive sheet 31. In this manner, half-etching is performed from the upper and lower surface sides. However, portions, of the conductive sheet 31, etched from both the upper surface side and the lower surface side are penetrated. After that, the masks 32*a* and 32*b* are removed.

Figure 12B:
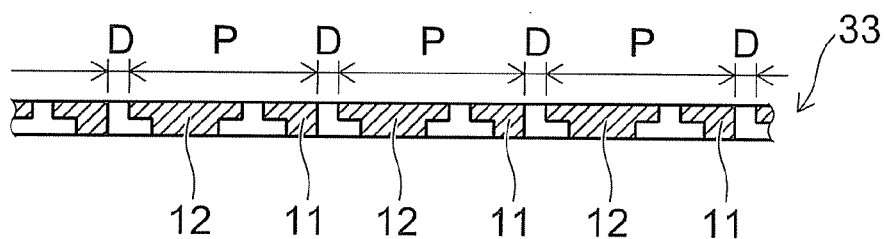

Thus, as shown in FIGS. 11 and 12B, the copper plate 31*a* and the silver plated layers 31*b* are selectively removed from the conductive sheet 31, and a lead frame sheet 33 is formed. Incidentally, for convenience of illustration, in FIG. 12B and the subsequent drawings, the copper plate 31*a* and the silver plated layer 31*b* are not distinguished from each other, and integrally illustrated as the lead frame sheet 33. For example, three blocks B are set in the lead frame sheet 33 as shown in FIG. 15A. In each of the blocks B, for example, approximately 1000 element regions P are set. As shown in FIG. 15B, the element regions P are arranged in a matrix pattern, and a dicing region D is formed in a lattice pattern among the element regions P. In each of the element regions P, a basic pattern including lead frames which are apart from each other is formed. The conductive material forming the conductive sheet 31 locally remains in the dicing region D in such a way as to connect the adjacent element regions P to each other.

Meanwhile, by performing half-etching when the lead frame sheet 33 is etched from the lower surface side thereof, projected portions are formed at the lower surfaces of the lead frames.

Figure 12C:
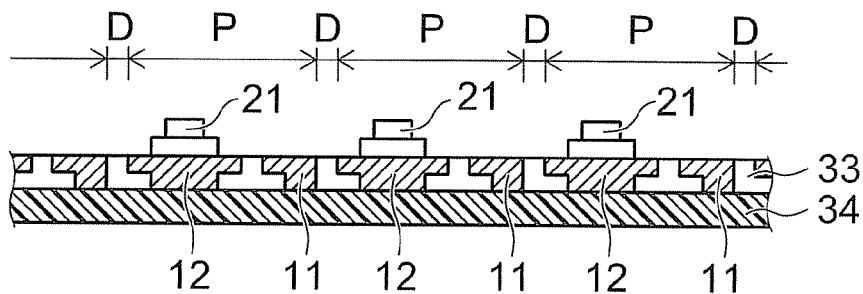

Next, as shown in FIGS. 11 and 12C, a reinforcement tape 34 made of, for example, a polyimide is pasted on the lower surface of the lead frame sheet 33. Then, a die mounting material (unillustrated) is attached onto each of the lead frames belonging to the element regions P of the lead frame sheet 33. Next, an LED chip 21 is mounted on the die mounting material. Next, a thermal treatment for sintering the die mounting material is performed (mount cure). Thus, in each of the element regions P of the lead frame sheet 33, the LED chip 21 is mounted on the lead frame with the die mounting material interposed therebetween.

Figure 12D:
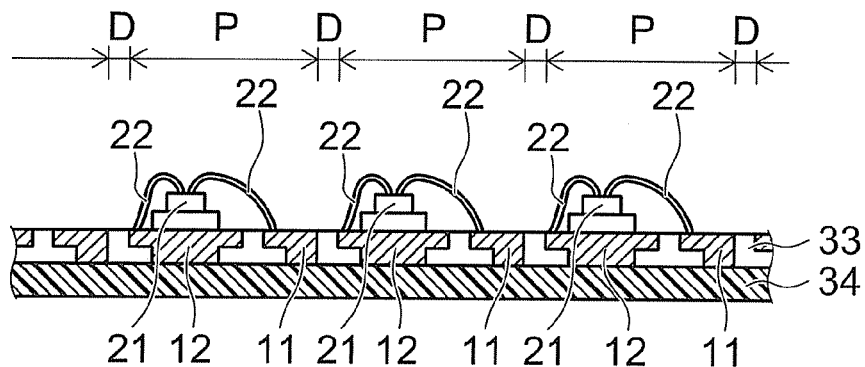

Next, as shown in FIGS. 11 and 12D, by ultrasonic bonding, for example, one end of a wire 22 is bonded to a terminal of the corresponding LED chip 21, and the other end of the wire 22 is bonded to the upper surface of the corresponding lead frame. Thus, each terminal provided on the upper surface of the LED chip is connected to the lead frame through the wire 22.

Figure 13A:
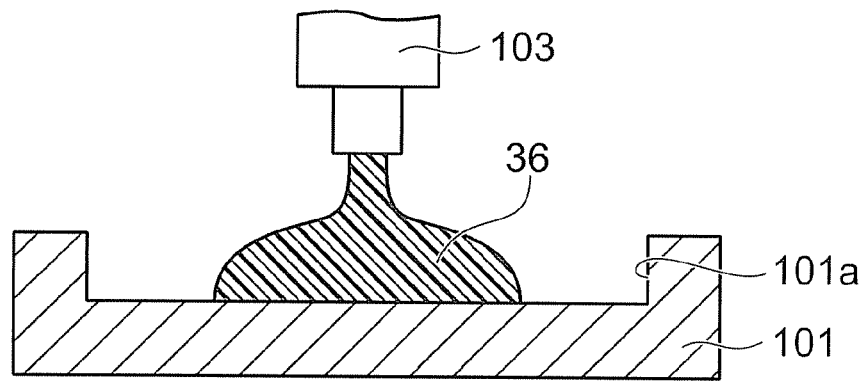

Next, as shown in FIGS. 11 and 13A, a lower mold 101 is prepared. The lower mold 101 and an upper mold 102 described below form a set of molds. In an upper surface of the lower mold 101, a rectangular parallelepiped-shaped recessed portion 101a is formed. Meanwhile, a liquid or semi-liquid resin material 36 is prepared from a transparent resin such as silicone. Note that, when the above-described LED package according to the eighth embodiment is manufactured, a diffusing agent is added to the resin material 36 and stirred. Then, the resin material 36 is supplied into the recessed portion 101a of the lower mold 101 with a dispenser 103.

Figure 13B:
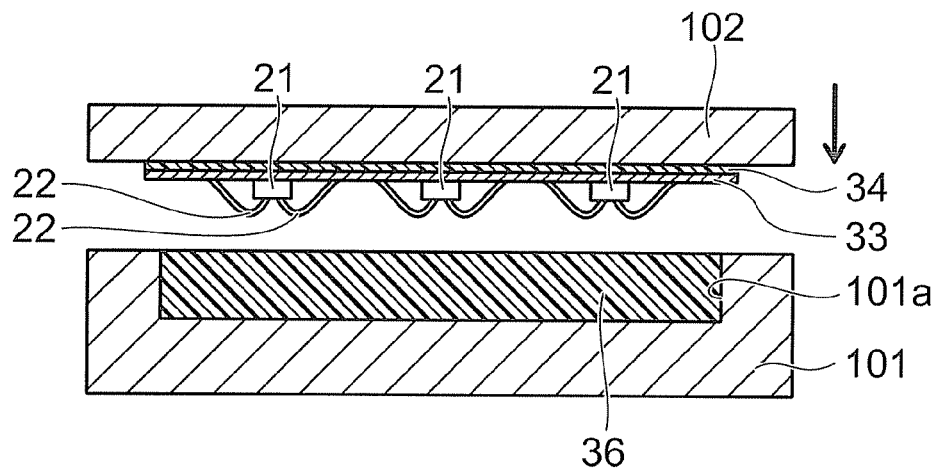

Next, as shown in FIGS. 11 and 13B, the lead frame sheet 33 on which the aforementioned LED chips 21 are mounted is provided on a lower surface of the upper mold 102 in a way that the LED chips 21 face downward. Then, the upper mold 102 is pressed against the lower mold 101, and the molds are clamped. Thereby, the lead frame sheet 33 is pressed against the resin material 36. In this event, the resin material 36 covers the LED chips 21 and the wires 22, and enters portions, of the lead frame sheet 33, left by the etching. In this manner, the resin material 36 is molded. This molding process is preferably performed in a vacuum atmosphere. This prevents air bubbles occurred in the resin material 36 from attaching to the portions, of the lead frame sheet 33, left by the half-etching.

Figure 13C:
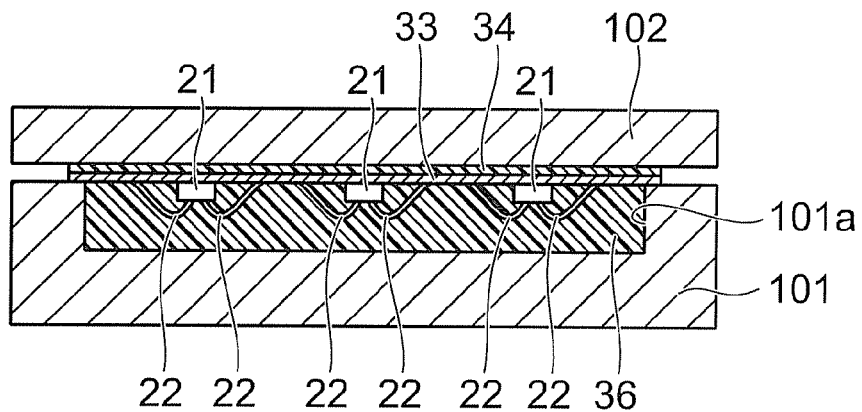
Figure 14A:
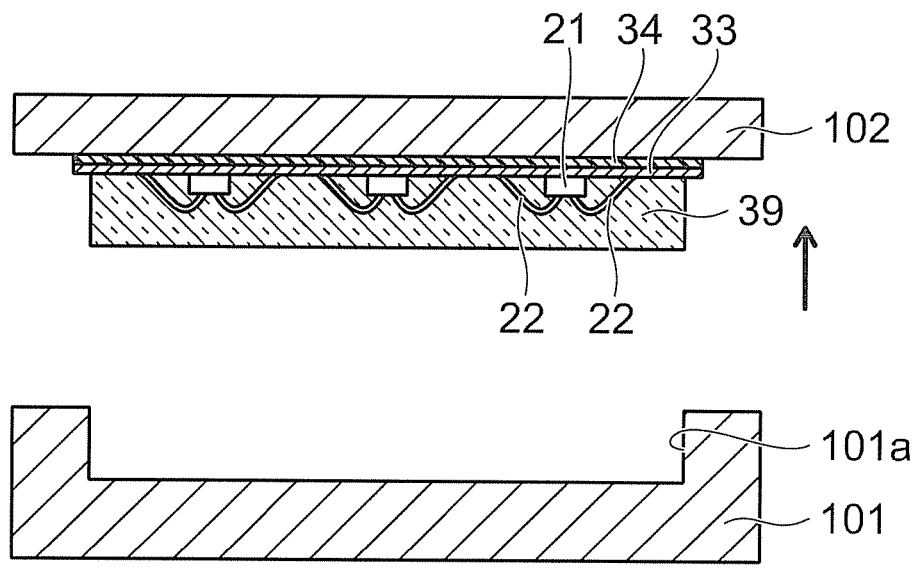

Next, as shown in FIGS. 11 and 13C, with an upper surface of the lead frame sheet 33 being pressed against the resin material 36, a thermal treatment (mold cure) is performed to cure the resin material 36. Then, the upper mold 102 is separated from the lower mold 101 as shown in FIG. 14A. Thus, a transparent resin plate 39 is formed on the lead frame sheet 33. The transparent resin plate 39 covers the entire upper surface and a portion of the lower surface of the lead frame sheet 33, and the LED chips 21 and so forth are buried therein. Subsequently, the reinforcement tape 34 is peeled from the lead frame sheet 33. Thereby, the lower surfaces of the projected portions of the lead frames are exposed on the surface of the transparent resin plate 39.

Figure 14B:
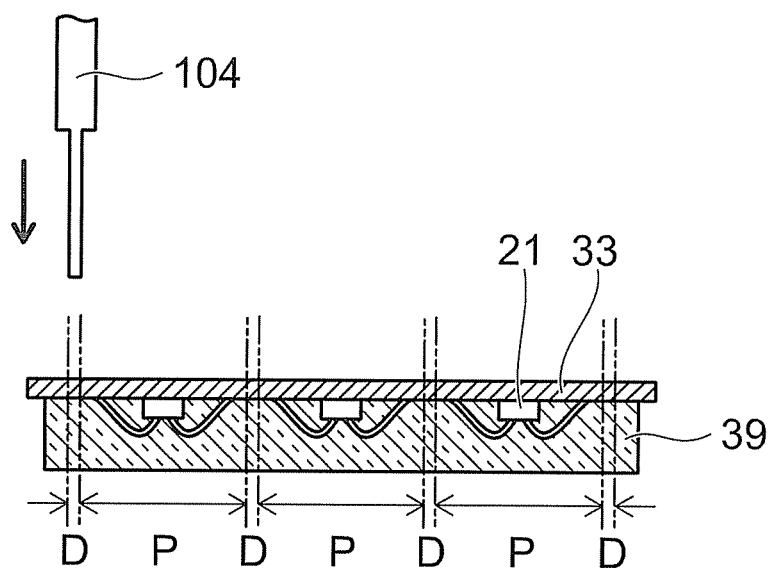

Next, as shown in FIGS. 11 and 14B, with a blade 104, an assembly of the lead frame sheet 33 and the transparent resin plate 39 is diced together from a side of the lead frame sheet 33. Specifically, the dicing is performed from the −Z direction side toward the +Z direction. Thereby, portions, of the lead frame sheet 33 and the transparent resin plate 39, disposed in the dicing region D are removed. As a result, portions, of the lead frame sheet 33 and the transparent resin plate 39, disposed in the element regions P are segmented, and thus LED packages are manufactured. Incidentally, the assembly of the lead frame sheet 33 and the transparent resin plate 39 may be diced from a side of the transparent resin plate 39.

In each of the LED packages after dicing, the lead frames are separated from the lead frame sheet 33. Moreover, the transparent resin plate 39 is parted to form transparent resin bodies 17. Tip edge surfaces of extending portions are exposed on side surfaces of the transparent resin body 17.

Next, as shown in FIG. 11, various tests are performed on the LED package. In this event, the tip edge surfaces of the extending portions can be used as test terminals.

Next, effects of this embodiment will be described.

In this embodiment, from the single conductive sheet 31, a large number, for example, approximately several thousands, of LED packages can be manufactured at once. Thus, the manufacturing cost per LED package is reduced. In addition, since no enclosure is provided, the numbers of components and processes are small, and the cost is low.

Moreover, in this embodiment, the lead frame sheet 33 is formed by wet-etching. For this reason, when an LED package of novel layout is manufactured, only the original plates of the masks need to be prepared. The initial cost is suppressed to a lower extent than a case where a lead frame sheet 33 is formed by a method such as pressing with a mold.

Furthermore, in this embodiment, the extending portions extend from the base portion of each lead frame. Thus, in the process of mounting the LED chip 21 shown in FIG. 12C, a lead frame 11 is supported by a lead frame in an adjacent element region P, and the mountability is high. Similarly, in the wire bonding process shown in FIG. 12D also, since bonding positions of the wires are supported, the ultrasound applied in the ultrasonic bonding, for example, scarcely escapes, and the wires are favorably bonded to the lead frames and the LED chips.

Still furthermore, in the dicing process shown in FIG. 14B of this embodiment, the dicing is performed from the lead frame sheet 33 side. Thereby, the metal material forming the end portions of the lead frames subjected to cutting stretch in the +Z direction on the side surface of the transparent resin body 17. For this reason, this metal material never stretches in the −Z direction on the side surface of the transparent resin body 17, nor protrudes from the lower surface of the LED package; hence, no burr is formed. Thus, when the LED package is mounted, mounting failure due to a burr never happens.

Next, a variation of this embodiment will be described.

This variation is a variation of a method for forming a lead frame sheet.

Specifically, in this variation, the method for forming a lead frame sheet shown in FIG. 15A is different from that in the above-described ninth embodiment.

FIGS. 16A to 16H are process sectional views for illustrating the method for forming a lead frame sheet of this variation.

Figure 16A:
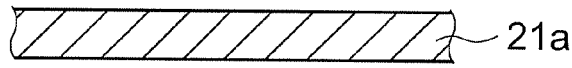
FIGS. 16A to 16H are process cross-sectional views illustrating a method for forming a lead frame sheet of a variation of the ninth embodiment.
Figure 16B:
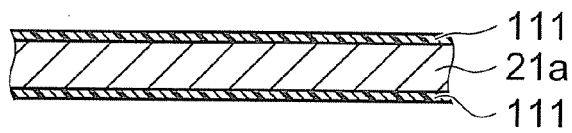
Figure 16C:
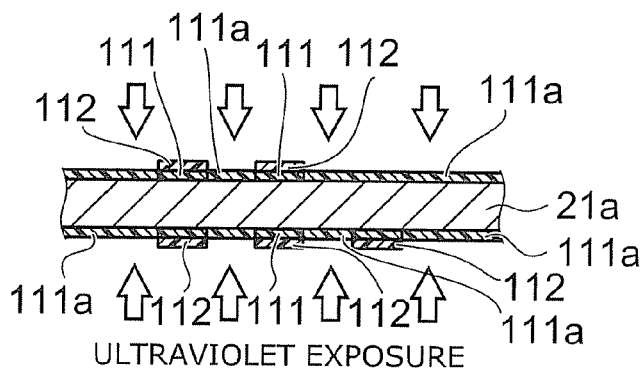
Figure 16D:
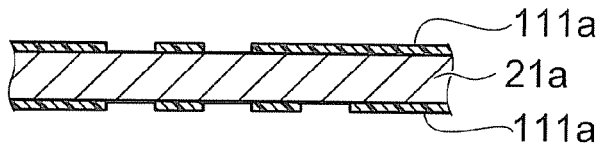
Figure 16E:
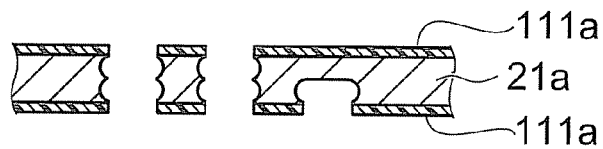
Figure 16F:
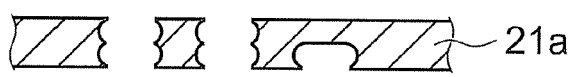
Figure 16G:
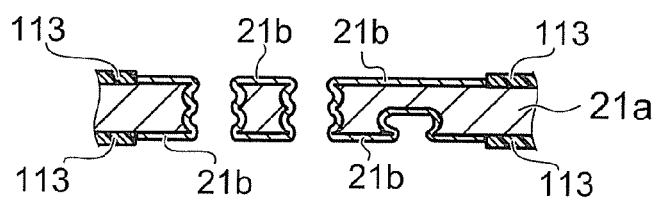
Figure 16H:
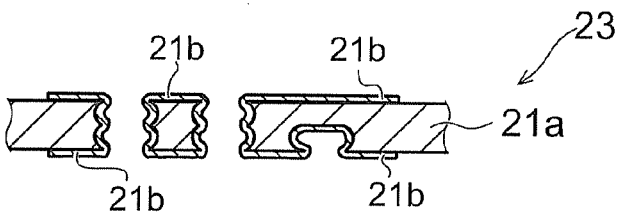

First, a copper plate 21a is prepared as shown in FIG. 16A, and cleaned. Next, as shown in FIG. 16B, both surfaces of the copper plate 21a are coated with a resist and then dried to form resist films 111. Next, as shown in FIG. 16C, mask patterns 112 are disposed on the resist films 111, and subjected to exposure with ultraviolet irradiation. Thereby, exposed portions of the resist films 111 are cured, and resist masks 111a are formed. Next, as shown in FIG. 16D, development is performed, and non-cured portions of the resist films 111 are washed away. Thereby, the resist patterns 111a remain on the upper and lower surfaces of the copper plate 21a. Next, as shown in FIG. 16E, using the resist patterns 111a as masks, etching is performed to remove exposed portions of the copper plate 21a in directions of both surfaces. In this event, the etching depth is approximately half the thickness of the copper plate 21a. Thereby, a region etched only from one surface side is half-etched, while a region etched from both surface sides is penetrated. Next, as shown in FIG. 16F, the resist patterns 111a are removed. Next, as shown in FIG. 16G, end portions of the copper plate 21a are covered with masks 113, and then plated. Thereby, silver plated layers 21b are formed on surfaces of portions, other than the end portions, of the copper plate 21a. Next, as shown in FIG. 16H, the resultant is cleaned, and the masks 113 are removed. After that, inspection is performed. In this manner, a lead frame sheet 23 is formed. Configurations and manufacturing method, effects other than the above, of this variation are the same as those of the above-described ninth embodiment.

Although the invention has been described with reference to the embodiments, the invention is not limited to these embodiments. Each of the above-described embodiments can be implemented in combination with the other embodiments. Moreover, those obtained through design alteration, addition, or deletion of the components, or those obtained through condition alteration, addition, or omission of the processes, which will be made appropriately on the above-described embodiments by those skilled in the art are included in the scope of the invention, as long as such variations include the gist of the invention.

For example, in the above-described ninth embodiment, an example has been shown that the lead frame sheet 33 is formed by wet-etching. However, the invention is not limited thereto. For example, the lead frame sheet 33 may be formed in a mechanical way such as pressing. Moreover, a groove may be formed on the upper surface of the lead frame between a region where a die mounting material is to be formed and a region where a wire is to be bonded. Alternatively, a recessed portion may be formed on the upper surface of the lead frame in a region where a die mounting material is to be formed. Thereby, even if the supply amount or supply position of the die mounting material varies, the die mounting material is prevented from flowing out to the region where the wire is to be bonded, and the wire bonding is prevented from being inhibited. Furthermore, the transparent resin body 17 may contain a phosphor.

Still furthermore, in the above-described first embodiment, an example has been shown that the lead frame is a copper plate and silver plated layers formed on the upper and lower surfaces of the copper plate. However, the invention is not limited thereto. For example, a rhodium (Rh) plated layer may be formed on at least one of silver plated layers respectively formed on the upper and lower surfaces of a copper plate. Alternatively, a copper (Cu) plated layer may be formed between a copper plate and a silver plated layer. Furthermore, a gold-silver alloy (Au—Ag alloy) plated layer may be formed on a nickel (Ni) plated layer formed on each of the upper and lower surfaces of a copper plate.

Still furthermore, in the above-described embodiments and variations thereof, examples have been shown that the base portion of the lead frame has a rectangular shape or a shape of a combination of rectangles when seen from above. However, the base portion may have a shape that at least one corner thereof is cut off. Thereby, the corner of the LED package with a right angle or an acute angle is chamfered, and thus will not serve as the origin of resin peeling and crack around the chamfered corner. As a result, the incidences of resin peeling and crack are suppressed in the LED package as a whole.

According to the above-described embodiments, an LED package high in durability and low in cost is provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or variations as would fall within the scope and spirit of the invention.

The invention claimed is:

1. An LED package comprising:
(2×n) (n is an integer of 2 or more) lead frames arranged to be apart from each other;
n LED chips above the lead frames, each of the n LED chips having one terminal connected to each of n lead frames of the (2×n) lead frames and another terminal connected to each of lead frames of the (2×n) lead frames other than the n lead frames, and the n LED chips being mounted on same one of the lead frame; and
a transparent resin body covering an entire upper surface, a portion of a lower surface, and a portion of an edge surface of each of the (2×n) lead frames, but exposing a remaining portion of the lower surface and a remaining portion of the edge surface and covering the n LED chips,
the resin body having a rectangular shape seen from above,
the lead frame on which the n LED chips are mounted including:
a first base portion; and
three first extending portions extending from the first base portion, a tip edge surface of each of the three first extending portions being exposed on each of three different side surfaces of the transparent resin body, side surfaces and lower surfaces of the three first extending portions being covered by the transparent resin body,
each of the lead frames other than the lead frame on which the n LED chips are mounted including:
a second base portion; and
a second extending portion extending from the second base portion, a tip edge surface of the second extending portion being exposed on the side surface of the transparent resin body, side surfaces and lower surface of the second extending portions being covered by the transparent resin body,
each of the first base portion and the second base portion including:
a thin plate portion, a lower surface of the thin plate portion being covered by the transparent resin body; and
a projected portion, a lower surface of the projected portion being exposed on a lower surface of the transparent resin body, and side surfaces of the projected portion being covered with the transparent resin body, and
the appearance of the transparent resin body being the appearance of the LED package.

2. The package according to claim 1, wherein
the n is 3 or more, and
the n LED chips includes an LED chip emitting red light, an LED chip emitting green light, and an LED chip emitting blue light.

3. The package according to claim 1, wherein
one of the LED chips has the one terminal formed on an upper surface of the LED chip and the another terminal formed on a lower surface of the LED chip.

4. The package according to claim 1, further comprising a Zener diode connected in parallel to one of the LED chips.

5. The package according to claim 1, wherein
each of the lead frames has an edge, the edge of one of the lead frames faces the edge of another of the lead frames, the projected portion is formed in a region being apart from the edge.

6. The package according to claim 1, wherein
the first base portion includes another projected portion, a lower surface of the another projected portion is exposed on the lower surface of the transparent resin body, side surfaces of the another projected portion are covered with the transparent resin body, and the projected portion and the another projected portion are separated from each other, a portion of the transparent resin body is disposed between the projected portion and the another projected portion.

7. The package according to claim 1, wherein one of the lead frames other than the lead frame on which the n LED chips are mounted is located between two of the three first extending portions.

8. The package according to claim 1, wherein the thin plate portion of the first base portion faces the thin plate portion of the second base portion.

9. The package according to claim 1, wherein one of the lead frames other than the lead frame on which the n LED chips are mounted further includes another second extending portion extending from the second base portion, a tip edge surface of the another second extending portion is exposed on the side surface of the transparent resin body, side surfaces and lower surface of the another second extending portions are covered by the transparent resin body.

10. An LED package comprising:
first to sixth lead frames arranged to be apart from each other;
a red LED chip emitting red light, the red LED chip being mounted on the first lead frame, and having one terminal connected to the first lead frame and another terminal connected to the second lead frame;
a blue LED chip emitting blue light, the blue LED chip being mounted at a position on the first lead frame where is situated nearer the third and the fourth lead frames in relation to the red LED chip, and having one terminal connected to the third lead frame and another terminal connected to the fourth lead frame;
a green LED chip emitting green light, the green LED chip being mounted at a position on the first lead frame where is situated nearer the fifth and the sixth lead frames in relation to the red LED chip, and having one terminal connected to the fifth lead frame and another terminal connected to the sixth lead frame; and
a transparent resin body having a rectangular parallelepiped shape, covering an entire upper surfaces, a portion of a lower surface, and a portion of one edge surface of each of the first to sixth lead frames, as well as the red LED chips, the blue LED chip and the green LED chip but exposing a remaining portion of the lower surface and a remaining portion of the one edge surface, the first lead frame including:
a first base portion; and
three first extending portions extending from the first base portion, a tip edge surface of each of the three first extending portions being exposed on each of three different side surfaces of the transparent resin body, side surfaces and lower surfaces of the three first extending portions being covered by the transparent resin body,
each of the second to sixth lead frames including:
a second base portion; and
a second extending portion extending from the second base portion, a tip edge surface of the second extending portion being exposed on the side surface of the transparent resin body, side surfaces and lower surfaces of the second extending portions being covered by the transparent resin body,
each of the first base portion and the second base portion including:
a thin plate portion, a lower surface of the thin plate portion being covered by the transparent resin body; and
a projected portion, a lower surface of the protected portion being exposed on a lower surface of the transparent resin body, and side surfaces of the projected portion being covered with the transparent resin body, and
the appearance of the transparent resin body being the appearance of the LED package.

11. The package according to claim 10, further comprising:
a first Zener diode mounted on the fourth lead frame, the first Zener diode having an upper surface terminal connected to the third lead frame and a lower surface terminal connected to the fourth lead frame; and
a second Zener diode mounted on the sixth lead frame, the second Zener diode having an upper surface terminal connected to the fifth lead frame and a lower surface terminal connected to the sixth lead frame.

12. The package according to claim 10, wherein
the first base portion includes another projected portion, a lower surface of the another projected portion is exposed on the lower surface of the transparent resin body, side surfaces of the another projected portion are covered with the transparent resin body, and the projected portion and the another projected portion are separated from each other, a portion of the transparent resin body is disposed between the projected portion and the another projected portion.

13. The package according to claim 10, wherein one of the second to sixth lead frames is located between two of the three first extending portions.

14. The package according to claim 10, wherein the thin plate portion of the first base portion faces the thin plate portion of the second base portion.

15. The package according to claim 10, wherein one of the second to sixth lead frames further includes another second extending portion extending from the second base portion, a tip edge surface of the another second extending portion is exposed on the side surface of the transparent resin body, side surfaces and lower surface of the another second extending portions are covered by the transparent resin body.

* * * * *